US012787759B2

(12) United States Patent
Park et al.

(10) Patent No.: US 12,787,759 B2
(45) Date of Patent: Nov. 3, 2026

(54) SEMICONDUCTOR DEVICE HAVING A REINFORCING INSULATING LAYER CORRESPONDING TO A VIA

(71) Applicant: SAMSUNG ELECTRONICS CO., LTD., Suwon-si (KR)

(72) Inventors: Kyoungpil Park, Suwon-si (KR); Doohwan Park, Suwon-si (KR); Sanghyun Lee, Suwon-si (KR); Hyeonmin Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 301 days.

(21) Appl. No.: 18/535,143

(22) Filed: Dec. 11, 2023

(65) Prior Publication Data

US 2024/0213160 A1 Jun. 27, 2024

(30) Foreign Application Priority Data

Dec. 12, 2022 (KR) ........................ 10-2022-0173047

(51) Int. Cl.
*H10W 20/48* (2026.01)
*H10W 20/42* (2026.01)
*H10W 90/00* (2026.01)

(52) U.S. Cl.
CPC ........... *H10W 20/48* (2026.01); *H10W 20/42* (2026.01); *H10W 90/701* (2026.01)

(58) Field of Classification Search
CPC ... H10W 20/42; H10W 90/701; H10W 20/48; H10W 20/47; H10W 20/435
See application file for complete search history.

(56) References Cited

U.S. PATENT DOCUMENTS

| | | | | |
|---|---|---|---|---|
| 7,573,132 | B2 | 8/2009 | Chung et al. | |
| 9,991,203 | B2 | 6/2018 | Kim et al. | |
| 10,181,441 | B2 | 1/2019 | Hsiao et al. | |
| 11,257,708 | B2 | 2/2022 | Shin et al. | |
| 2022/0199526 | A1 | 6/2022 | Han et al. | |
| 2023/0215855 | A1 * | 7/2023 | Tsai ...................... | H10W 90/00 257/621 |

FOREIGN PATENT DOCUMENTS

| | | |
|---|---|---|
| KR | 10-0753420 | 8/2007 |
| KR | 10-2012-0121796 | 11/2012 |
| KR | 10-2013-0058402 A | 6/2013 |
| KR | 10-2013-0065226 A | 6/2013 |
| KR | 10-2022-0091660 | 7/2022 |
| KR | 10-2022-0101377 A | 7/2022 |

OTHER PUBLICATIONS

Notice of Allowance issued Aug. 20, 2026 in corresponding Korean Patent Application No. 10-2022-0173047.

* cited by examiner

*Primary Examiner* — Changhyun Yi
(74) *Attorney, Agent, or Firm* — Morgan, Lewis & Bockius LLP

(57) ABSTRACT

A semiconductor device includes a first wiring level layer including a lower wiring layer, a second wiring level layer on the first wiring level layer and including an upper wiring layer, a via level layer positioned between the first wiring level layer and the second wiring level layer and including a via connecting the lower wiring layer to the upper wiring layer, and a reinforcing insulating layer positioned between the lower wiring layer and the upper wiring layer in the via level layer.

20 Claims, 23 Drawing Sheets

SEMICONDUCTOR DEVICE HAVING A REINFORCING INSULATING LAYER CORRESPONDING TO A VIA

CROSS-REFERENCE TO RELATED APPLICATION

This application is based on and claims priority under 35 U.S.C. § 119 to Korean Patent Application No. 10-2022-0173047, filed on Dec. 12, 2022, in the Korean Intellectual Property Office, the disclosure of which is incorporated by reference herein in its entirety.

TECHNICAL FIELD

The inventive concept relates to a semiconductor device, and more particularly, to a semiconductor device having a reinforcing insulating layer corresponding to a via level layer.

DESCRIPTION OF RELATED ART

As electronic devices including semiconductor devices are miniaturized, the size of the semiconductor devices may also be reduced. To this end, a height of a via, which is arranged between an upper wiring layer and a lower wiring layer of the semiconductor device, may be reduced. When the height of the via is low in the semiconductor device, an electrical insulation between the upper wiring layer and the lower wiring layer may be deteriorated or the electrical performance of the semiconductor device may be deteriorated due to electrical leakage.

SUMMARY

The inventive concept provides a semiconductor device having improved electrical insulation or a reduced leakage current between an upper wiring layer and a lower wiring layer although a height of a via is low.

According to an aspect of the inventive concept, there is provided a semiconductor device including a first wiring level layer including a lower wiring layer, a second wiring level layer on the first wiring level layer and including an upper wiring layer, a via level layer positioned between the first wiring level layer and the second wiring level layer and including a via connecting the lower wiring layer to the upper wiring layer, and a reinforcing insulating layer positioned between the lower wiring layer and the upper wiring layer in the via level layer.

According to another aspect of the inventive concept, there is provided a semiconductor device including a semiconductor substrate including a first voltage region and a second voltage region, a first wiring level layer on the semiconductor substrate and including a first lower wiring layer positioned in the first voltage region and a second lower wiring layer positioned in the second voltage region, a second wiring level layer on the first wiring level layer and including a first upper wiring layer positioned in an upper portion of the first voltage region and a second upper wiring layer positioned in an upper portion of the second voltage region, a via level layer positioned between the first wiring level layer and the second wiring level layer and including a via connecting the first lower wiring layer to the first upper wiring layer, and a reinforcing insulating layer positioned between the second lower wiring layer and the second upper wiring layer in the via level layer.

According to another aspect of the inventive concept, there is provided a semiconductor device including a semiconductor substrate including a low voltage region and a high voltage region, a first wiring level layer on the semiconductor substrate and including a low voltage lower wiring layer positioned in the low voltage region, a high voltage lower wiring layer positioned in the high voltage region, and a first wiring insulating layer insulating the low voltage lower wiring layer and the high voltage lower wiring layer, a second wiring level layer on the first wiring level layer and including a low voltage upper wiring layer positioned in the low voltage region, a high voltage upper wiring layer positioned in the high voltage region, and a second wiring insulating layer insulating the low voltage upper wiring layer and the high voltage upper wiring layer, a via level layer positioned between the first wiring level layer and the second wiring level layer and including a via connecting the low voltage lower wiring layer to the low voltage upper wiring layer and a via insulating layer between the first wiring level layer and second wiring level layer, and a reinforcing insulating layer positioned between the high voltage lower wiring layer and the high voltage upper wiring layer in the via insulating layer of the via level layer.

BRIEF DESCRIPTION OF THE DRAWINGS

Embodiments will be more clearly understood from the following detailed description taken in conjunction with the accompanying drawings in which.

DETAILED DESCRIPTION

Hereinafter, embodiments of the inventive concept will be described in detail with reference to the accompanying drawings. Embodiments of the inventive concept may be implemented alone or in combination. Technical details of the inventive concept are not limited to any embodiment.

In the present specification, the singular forms of the components may include a plurality of forms, unless the context clearly dictates otherwise. In the present specification, the drawings may be exaggerated to explain the inventive concept more clearly.

Figure 1:
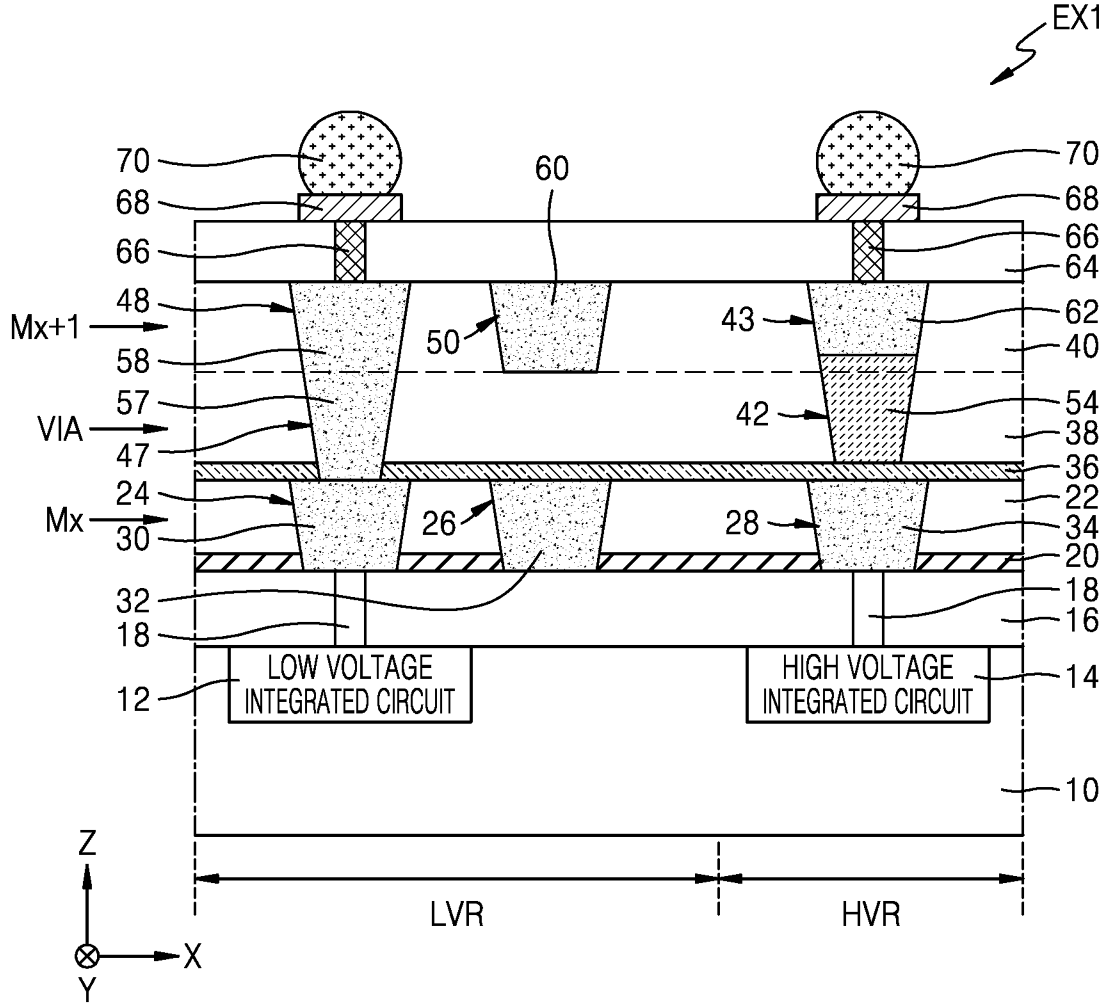
FIG. 1 is a cross-sectional view illustrating a semiconductor device according to an embodiment.

FIG. 1 is a cross-sectional view illustrating a semiconductor device, according to an embodiment.

Specifically, a semiconductor device EX1 may include a semiconductor substrate 10. In the following drawings, an X direction and a Y direction may be directions parallel to a surface of the semiconductor substrate 10. The Y direction may be a direction perpendicular to the X direction on the surface of the semiconductor substrate 10. The X direction and the Y direction may form a plane. In the following drawings, a Z direction may be a direction perpendicular to the surface of the semiconductor substrate 10. The Z direction may be a direction perpendicular to the plane formed by the X direction and the Y direction.

The semiconductor substrate 10 may include a semiconductor wafer. The semiconductor substrate 10 may include a group IV material or a compound of group III-V materials. The semiconductor substrate 10 may be a single crystal wafer, for example, a silicon single crystal wafer.

The semiconductor substrate 10 is not limited to a single crystal wafer, and may be various wafers, such as an epi or epitaxial wafer, a polished wafer, an annealed wafer, a silicon on insulator (SOI) wafer, etc. The epitaxial wafer may be a wafer in which a crystalline material is grown on a single crystal silicon substrate. The semiconductor substrate 10 may include a silicon substrate.

The semiconductor substrate 10 may include a low voltage region LVR and a high voltage region HVR. For example, the low voltage region LVR and the high voltage region HVR may be adjacent regions in the X direction. A low voltage integrated circuit 12 may be disposed in the low voltage region LVR of the semiconductor substrate 10. The low voltage region LVR may include a cell area in which a standard cell is arranged. The cell area may be a logic cell area or a memory cell area.

A high voltage integrated circuit 14 may be disposed in the high voltage region HVR of the semiconductor substrate 10. The high voltage region HVR may be an area other than the standard cell area. Accordingly, the semiconductor device EX1 may include the low voltage integrated circuit 12 and the high voltage integrated circuit 14.

The low voltage integrated circuit 12 may include a circuit operating at low voltage, for example, a voltage of about 1 volt or less. In some embodiments, the low voltage integrated circuit 12 may include a circuit operating at about 0.7 volt or less.

The high voltage integrated circuit 14 may include a circuit that operates at a high voltage, for example, a voltage greater than about 1 volt. In some embodiments, the high voltage integrated circuit 14 may include a circuit operating at about 1.2 volt to about 3.3 volt.

The low voltage integrated circuit 12 and the high voltage integrated circuit 14 may include circuit elements, such as transistors, capacitors, and/or resistors. Depending on the types of the low voltage integrated circuit 12 and the high voltage integrated circuit 14, the semiconductor device EX1 may function as a memory device or a logic device.

For example, the memory device may include dynamic random access memory (DRAM), static random access memory (SRAM), flash memory, electrically erasable programmable read-only memory (EEPROM), phase-change random access memory (PRAM), magnetic random access memory (MRAM), resistive random access memory (RRAM), etc. The types of the low voltage integrated circuit 12 and the high voltage integrated circuit 14 are well known in the related arts, and the scope of the inventive concept is not limited thereto.

The semiconductor device EX1 may include an interlayer insulating layer 16 positioned on the semiconductor substrate 10, the low voltage integrated circuit 12, and the high voltage integrated circuit 14. The interlayer insulating layer 16 may include a silicon oxide layer. First contact plugs 18 may be disposed in the interlayer insulating layer 16 and electrically connected to the low voltage integrated circuit 12 and the high voltage integrated circuit 14. The first contact plug 18 may include a metal layer, for example, a tungsten layer.

The semiconductor device EX1 may include a first wiring level layer Mx that is positioned on the interlayer insulating layer 16 and on the first contact plug 18. The first wiring level layer Mx may include a first etch stopping layer 20, first wiring layer 30, second wiring layers 32, and third lower wiring layer 34, and a first wiring insulating layer 22. The first to third lower wiring layers 30, 32, and 34 may be collectively referred to as lower wiring layer.

The first etch stopping layer 20 may include a material having an etching selectivity with respect to the first wiring insulating layer 22. The first etch stopping layer 20 may include a silicon nitride layer. The first wiring insulating layer 22 may include a silicon oxide layer.

The first to third lower wiring layers 30, 32, and 34 may include a metal layer, for example, a copper layer, an aluminum layer, or a tungsten layer. The first to third lower wiring layers 30, 32, and 34 may be buried in the first contact hole 24, second contact holes 26, and third lower contact hole 28 that are provided in the first etch stopping layer 20 and the first wiring insulating layer 22. For example, the first to third lower wiring layers 30, 32, and 34 in the first contact hole 24, second contact holes 26, and third lower contact hole 28, respectively, may penetrate the first etch stopping layer 20 and the first wiring insulating layer 22.

The first and second lower wiring layers 30 and 32 may be positioned at an upper portion of the low voltage region LVR. The first and second lower wiring layers 30 and 32 may be lower wiring layers for low voltage. The third lower wiring layer 34 may be positioned at an upper portion of the high voltage region HVR. The third lower wiring layer 34 may be a lower wiring layer for high voltage. In some embodiments, upper widths of the first to third lower wiring layers 30, 32, and 34 may be greater than lower widths thereof.

In an embodiment, the first wiring level layer Mx may include three layers (the first to third lower wiring layers 30, 32, and 34), however, additional lower wiring layers may be included in the first wiring level layer Mx. In an embodiment, the first wiring level layer Mx may include the first etch stopping layer 20, however, the first etch stopping layer 20 may not be included in the first wiring level layer MX, if necessary.

The semiconductor device EX1 may include a via level layer VIA that is positioned on the first wiring insulating layer 22 and the first to third lower wiring layers 30, 32, and 34. The via level layer VIA may be positioned on the first wiring level layer Mx. The via level layer VIA may include a second etch stopping layer 36, a via 57, and a via insulating layer 38.

The second etch stopping layer 36 may be a material having an etching selectivity with respect to the via insulating layer 38. The second etch stopping layer 36 may include a silicon nitride layer. The via insulating layer 38 may include a silicon oxide layer.

The via 57 may be buried in a via hole 47 through the second etch stopping layer 36 and the second via insulating layer 38. For example, the via 57 in a via hole 47 may penetrate the second etch stopping layer 36 and the second via insulating layer 38. The via 57 may include a metal layer, for example, a copper layer, an aluminum layer, and a tungsten layer. The via 57 may include the same material as the first to third lower wiring layers 30, 32, and 34 described herein.

The via 57 may be electrically connected to at least one of the first to third lower wiring layers 30, 32, and 34. In FIG. 1, the via 57 may be electrically connected to the first lower wiring layer 30. In an embodiment, the via level layer VIA may include the second etch stopping layer 36, but the second etch stopping layer 36 may not be included in the via level layer VIA, if necessary.

The semiconductor device EX1 may include a reinforcing insulating layer 54 that is positioned in a reinforced contact hole 42 of the via insulating layer 38 correspondently to the via level layer VIA. The reinforcing insulating layer 54 may be positioned on the first wiring level layer Mx. The reinforcing insulating layer 54 may be positioned on the second etch stopping layer 36.

In some embodiments, an upper surface of the reinforcing insulating layer 54 may be positioned in the second wiring insulating layer 40 as described hereinafter. In some embodiments, the reinforcing insulating layer 54 may include a material having a dielectric constant that is greater than a dielectric constant of the via insulating layer 38. In some embodiments, the reinforcing insulating layer 54 may include a material having a dielectric constant that is greater than dielectric constants of the first wiring insulating layer 22, the via insulating layer 38, and the second wiring insulating layer 40. The reinforcing insulating layer 54 may include a material having a dielectric constant that is greater than a dielectric constant of a silicon oxide layer.

The reinforcing insulating layer 54 may include a metal oxide and a metal oxynitride. In some embodiments, the reinforcing insulating layer 54 may include a hafnium oxide layer ($HfO_2$), a hafnium silicon oxide layer (HfSiO), a hafnium silicon nitride layer (HfSiON), a hafnium tantalum oxide layer (HfTaO), a hafnium titanium oxide layer (HfTiO), a hafnium zirconium oxide layer (HfZrO), a zirconium oxide layer ($ZrO_2$), an aluminum oxide layer ($Al_2O_3$), or a combination thereof, but is not limited thereto. In some embodiments, the reinforcing insulating layer 54 may include a silicon nitride layer.

As described herein, the reinforcing insulating layer 54 may be positioned between a third upper wiring layer 62 and the third lower wiring layer 34. The reinforcing insulating layer 54 may improve an electrical insulation between the third upper wiring layer 62 and the third lower wiring layer 34. For example, the reinforcing insulation layer 54 may reinforce an insulating property of the semiconductor device EX1 between the third upper wiring layer 62 and the third lower wiring layer 34, which may reduce a leakage current. More particularly, the reinforcing insulation layer 54 may reinforce an insulating property of the via insulating layer 38.

The semiconductor device EX1 may include a second wiring level layer Mx+1 positioned on the via 57, the via insulating layer 38, and the reinforcing insulating layer 54. The second wiring level layer Mx+1 may be positioned on the via level layer VIA and the reinforcing insulating layer 54. The second wiring level layer Mx+1 may include first upper wiring layer 58, second upper wiring layer 60, and third upper wiring layer 62 and a second wiring insulating layer 40. The first to third upper wiring layers 58, 60, and 62 may be collectively referred to as upper wiring layers.

The second wiring insulating layer 40 may include a silicon oxide layer. The first to third upper wiring layers 58, 60, and 62 may include a metal layer, for example, a copper layer, an aluminum layer, or a tungsten layer. The first to third upper wiring layers 58, 60, and 62 may be buried in first upper contact hole 48, second upper contact hole 50, and third upper contact hole 43 of the second wiring insulating layer 40, respectively.

The first and second upper wiring layers 58 and 60 may be positioned at an upper portion of the low voltage region LVR. The first and second upper wiring layers 58 and 60 may include upper wiring layers for low voltage. The third upper wiring layer 62 may be positioned at an upper portion of the high voltage region HVR. The third upper wiring layer 62 may include an upper wiring layer for high voltage.

The first upper wiring layer 58 may be connected to the first lower wiring layer 30 through the via 57. The third upper wiring layer 62 may be positioned on the reinforcing insulating layer 54. The reinforcing insulating layer 54 may be positioned between the third lower wiring layer 34 and the third upper wiring layer 62. The reinforcing insulating layer 54 may penetrate at least a portion of the second wiring insulating layer 40. The reinforcing insulating layer 54 and the second etch stopping layer 36 may be positioned between the third lower wiring layer 34 and the third upper wiring layer 62. The reinforcing insulating layer 54 and the second etch stopping layer 36 may improve the electrical insulation between the third lower wiring layer 34 and the third upper wiring layer 62.

In some embodiments, upper widths of the first to third upper wiring layers 58, 60, and 62 may be greater than lower widths thereof. For example, slopes of sidewalls of the first to third upper wiring layers 58, 60, and 62 may be configured such that the widths of the first to third upper wiring layers 58, 60, and 62 may decrease downward in the Z direction. In an embodiment, the second wiring level layer Mx+1 may include three layers (the first to third upper wiring layers 58, 60, and 62), however, additional upper wiring layers may be included in the second wiring level layer Mx+1.

In an embodiment, though a single layer group of the first wiring level layer Mx, the via level layer VIA, and the second wiring level layer Mx+1 is illustrated, the semiconductor device EX1 may also include a plurality of layer groups in which two or more layer groups are stacked on the semiconductor substrate 10.

The semiconductor device EX1 may include a passivation layer 64 positioned on the first to third upper wiring layers 58, 60, and 62 and the second wiring insulating layer 40. The passivation layer 64 may include a silicon oxide layer. A second contact plug 66 may be provided in the passivation layer 64 and be electrically connected to the first and third upper wiring layers 58 and 62. The second contact plug 66 may include a metal layer, for example, a tungsten layer.

The semiconductor device EX1 may include a bump pad 68 on the second contact plug 66 and a solder ball 70 on the bump pad 68. The bump pad 68 may include aluminum (Al), copper (Cu), nickel (Ni), cobalt (Co), zinc (Zn), gold (Au), silver (Ag), platinum (Pt), or an alloy thereof.

The solder ball 70 may be electrically connected to an external device. The solder ball 70 may include a metal, such as nickel (Ni), copper (Cu), gold (Au), silver (Ag), aluminum (Al), tungsten (W), titanium (Ti), tantalum (Ta), indium (In), molybdenum (Mo), manganese (Mn), cobalt (Co), tin (Sn), magnesium (Mg), rhenium (Re), beryllium (Be), gallium (Ga), ruthenium (Ru), bismuth (Bi), or an alloy thereof.

According to some embodiments of the semiconductor device EX1 described herein, the reinforcing insulating layer 54 may be provided between the third upper wiring layer 62 and the third lower wiring layer 34 correspondently to the via level layer VIA. For example, the reinforcing insulating layer 54 may be provided between the third upper wiring layer 62 and the third lower wiring layer 34 correspondently to the via level layer VIA may improve the electrical insulation and reduce the leakage current. Thus, the electrical performance of the semiconductor device EX1 according to an embodiment may be improved due to the reinforcing insulating layer 54.

Figure 2A:
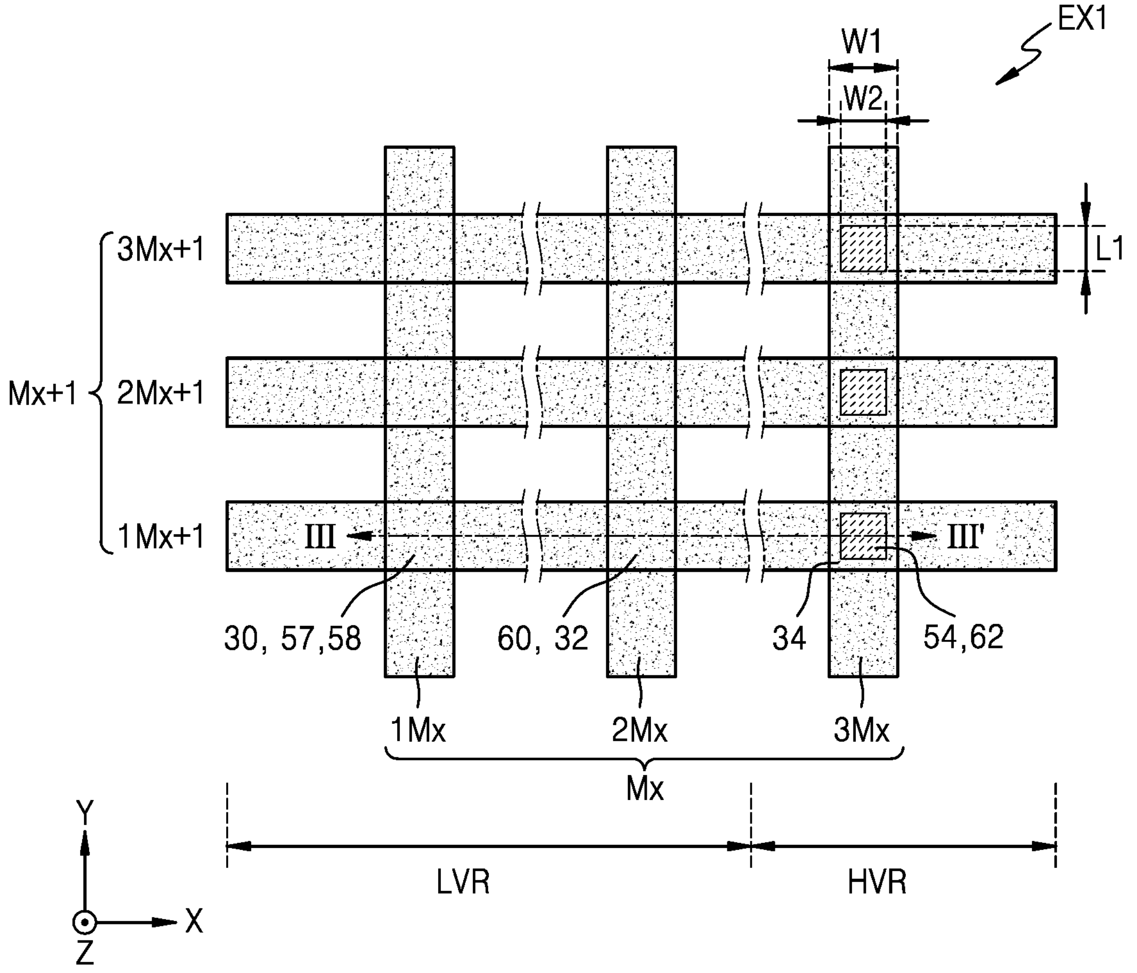
FIG. 2A is a layout showing upper and lower wiring layers and a via of a semiconductor device according to an embodiment.

FIG. 2A is a layout showing upper and lower wiring layers and a via of a semiconductor device according to an embodiment.

Specifically, FIG. 2A may be a layout showing upper and lower wirings and a via of the semiconductor device shown in FIG. 1. In FIG. 2A, the same reference numeral denotes the same element in FIG. 1 and the descriptions on the same elements may be briefly given or omitted. The semiconductor device EX1 may include the first wiring level layer Mx and the second wiring level layer Mx+1. The second wiring level layer Mx+1 may be positioned over the first wiring level layer Mx. For example, the second wiring level layer Mx+1 may be positioned over the first wiring level layer Mx in the Z direction.

The first wiring level layer Mx may include a first sub-wiring level layer 1Mx, a second-wiring level layer 2Mx, and a third sub-wiring level layer 3Mx. The first sub-wiring level layer 1Mx and the second sub-wiring level layer 2Mx may be positioned in the low voltage region LVR in a plan view. The third sub-wiring level layer 3Mx may be positioned in the high voltage region HVR in a plan view. The first to third sub-wiring level layers 1Mx, 2Mx, and 3Mx may extend in the Y direction and may be spaced apart from each other in the X direction.

The first wiring level layer Mx may extend in the Y direction and may be spaced apart from each other in the X direction. The first wiring level layer Mx may include first to third lower wiring layers 30, 32, and 34. The first to third lower wiring layers 30, 32, and 34 may extend in the Y direction and may be spaced apart from each other in the X direction.

The second wiring level layer Mx+1 may include a fourth sub-wiring level layer 1Mx+1, a fifth sub-wiring level layer 2Mx+1, and a sixth sub-wiring level layer 3Mx+1. The fourth to sixth sub-wiring level layers 1Mx+1, 2Mx+1, and 3Mx+1 may be positioned across the low voltage region LVR and the high voltage region HVR in a plan view. The fourth to sixth sub-wiring level layers 1Mx+1, 2Mx+1, and 3Mx+1 may extend in the Y direction and may be spaced apart from each other in the X direction.

The second wiring level layer Mx+1 may extend in the X direction and may be spaced apart in the Y direction. The second wiring level layer Mx+1 may include first to third upper wiring layers 58, 60, and 62. The first to third upper wiring layers 58, 60, and 62 may extend in the X direction and may be spaced apart from each other in the Y direction.

In the semiconductor device EX1, the via 57 may be disposed at each cross point of the first wiring level layer Mx and the second wiring level layer Mx+1. In some embodiments, the via 57 may be positioned at the cross point of the first sub-wiring level layer 1Mx and the fourth sub-wiring level layer 1Mx+1.

In the semiconductor device EX1, the reinforcing insulating layer 54 may be disposed at each cross point of the first wiring level layer Mx and the second wiring level layer Mx+1. In some embodiments, the reinforcing insulating layer 54 may be positioned at the cross points of the third sub-wiring level layer 3Mx and the fourth sub-wiring level layer 1Mx+1, of the third sub-wiring level layer 3Mx and the fifth sub-wiring level layer 2Mx+1, and of the third sub-wiring level layer 3Mx and the sixth sub-wiring level layer 3Mx+1.

The reinforcing insulating layer 54 may have a length L1 in the Y direction. A width W2 of the reinforcing insulating layer 54 in the X direction may be equal to or less than a width W1 of the third sub-wiring level layer 3Mx. However, the case that the width W2 of the reinforcing insulating layer 54 in the X direction is less than the width W1 of the third sub-wiring level layer 3Mx is only shown in FIG. 2A. As described herein, the reinforcing insulating layer 54 may improve the electrical insulation between the third sub-wiring level layer 3Mx and the second wiring level layer Mx+1.

Figure 2B:
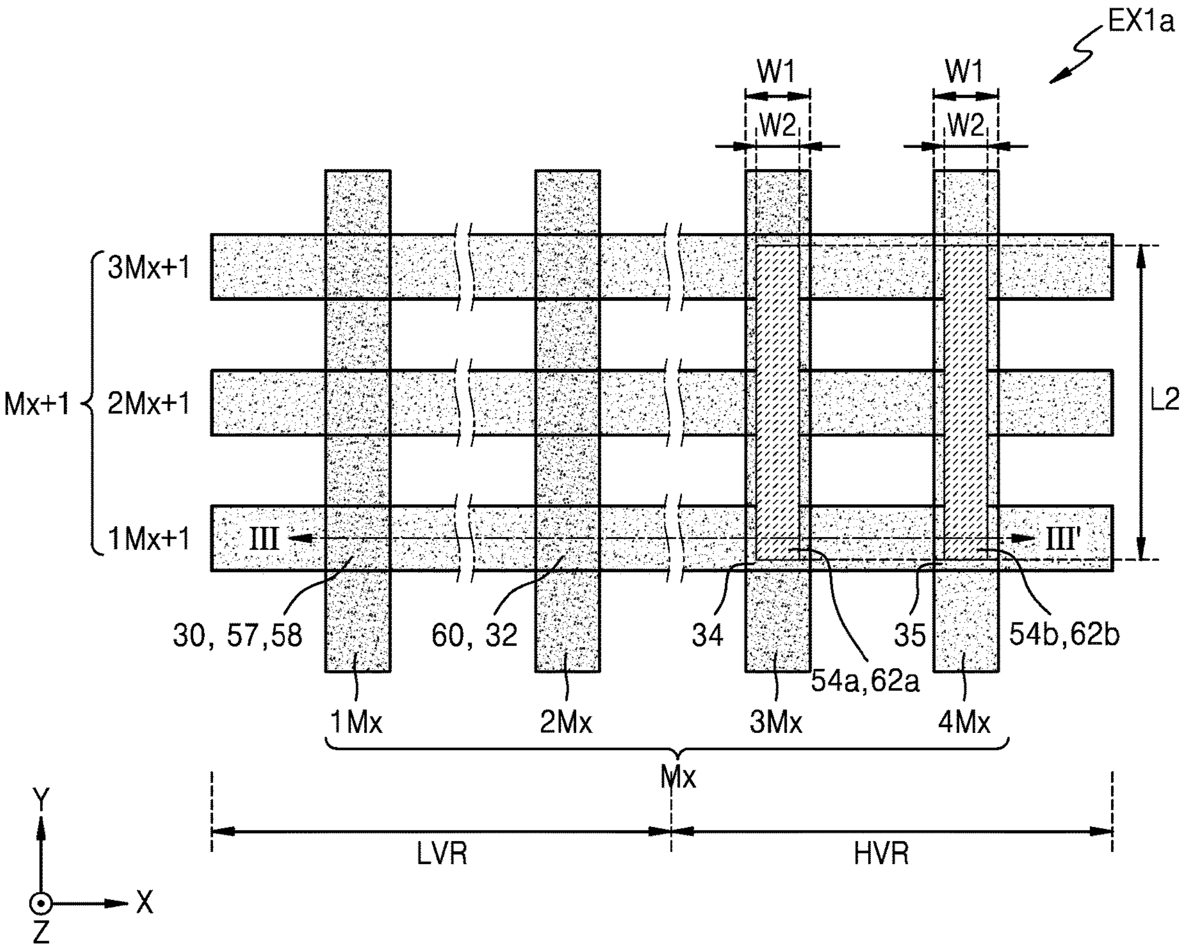
FIG. 2B is a layout showing upper and lower wiring layers and a via of a semiconductor device according to an embodiment.

FIG. 2B is a layout showing upper and lower wiring layers and a via of a semiconductor device according to an embodiment.

Specifically, the semiconductor device EX1*a* shown in FIG. 2B is a modification of the semiconductor device EX1 shown in FIG. 1 and FIG. 2A. The semiconductor device EX1*a* shown in FIG. 2B may have substantially the same structures as the semiconductor device EX1 shown in FIG. 1 and FIG. 2A, except that a seventh sub-wiring level layer 4Mx is further included and reinforcing insulating layers 54*a* and 54*b* extend in the Y direction. In FIG. 2B, the same reference numeral denotes the same element in FIG. 1 and FIG. 2A, and the descriptions on the same elements may be briefly given or omitted.

The semiconductor device EX1*a* may include the first wiring level layer Mx and the second wiring level layer Mx+1. The second wiring level layer Mx+1 may be positioned over the first wiring level layer Mx. For example, the second wiring level layer Mx+1 may be positioned over the first wiring level layer Mx in the Z direction. The first wiring level layer Mx may include the first sub-wiring level layer 1Mx, the second-wiring level layer 2Mx, the third sub-wiring level layer 3Mx, and a seventh sub-wiring level layer 4Mx.

The first sub-wiring level layer 1Mx and the second sub-wiring level layer 2Mx may be positioned in the low voltage region LVR in a plan view. The third sub-wiring level layer 3Mx and the seventh sub-wiring level layer 4MX may be positioned in the high voltage region HVR in a plan view. The first sub-wiring level layer 1Mx, the second sub-wiring level layer 2Mx, the third sub-wiring level layer 3Mx, and the seventh sub-wiring level layer 4Mx may extend in the Y direction and may be spaced apart from each other in the X direction.

The first wiring level layer Mx may extend in the Y direction and may be spaced apart from each other in the X direction. The first wiring level layer Mx may include the first lower wiring layer 30, the second lower wiring layer 32, the third lower wiring layers 34, and a fourth lower wiring layer 35. The first to fourth lower wiring layers 30, 32, 34, and 35 may extend in the Y direction and may be spaced apart from each other in the X direction.

The second wiring level layer Mx+1 may include the fourth sub-wiring level layer 1Mx+1, the fifth sub-wiring level layer 2Mx+1, and the sixth sub-wiring level layer 3Mx+1. The fourth to sixth sub-wiring level layers 1Mx+1, 2Mx+1, and 3Mx+1 may be positioned across the low voltage region LVR and the high voltage region HVR in a plan view. The fourth to sixth sub-wiring level layers 1Mx+1, 2Mx+1, and 3Mx+1 may extend in the Y direction and may be spaced apart from each other in the X direction.

The second wiring level layer Mx+1 may extend in the X direction and may be spaced apart in the Y direction. The second wiring level layer Mx+1 may include first to fourth upper wiring layers 58, 60, 62*a* and 62*b*. The first to fourth upper wiring layers 58, 60, 62*a* and 62*b* may extend in the X direction and may be spaced apart from each other in the Y direction.

In the semiconductor device EX1*b*, the via 57 may be disposed at each cross point of the first wiring level layer Mx and the second wiring level layer Mx+1. In some embodiments, the via 57 may be positioned at the cross point of the first sub-wiring level layer 1Mx and the fourth sub-wiring level layer 1Mx+1.

In the semiconductor device EX1*a*, reinforcing insulating layers 54*a* and 54*b* may be disposed at cross points and non-cross points of the first wiring level layer Mx and the second wiring level layer Mx+1. In some embodiments, the reinforcing insulating layers 54*a* and 54*b* may be formed between the first wiring level layer Mx and the second wiring level layer Mx+1. The reinforcing insulating layers 54*a* and 54*b* may be formed on the third sub-wiring level layer 3Mx and the seventh sub-wiring level layer 4Mx and extend in the Y direction. The reinforcing insulating layers 54*a* and 54*b* may have a length L2 in the Y direction.

While two reinforcing insulating layers 54*a* and 54*b* may be disposed on the third sub-wiring level layer 3Mx and the seventh sub-wiring level layer 4Mx in FIG. 2B, one of the reinforcing insulating layers 54*a* and 54*b* may be included in the semiconductor device EX1*a*. Widths W2 of the reinforcing insulating layers 54*a* and 54*b* in the X direction may be less than or equal to the width W1 of the third sub-wiring level layer 3Mx.

However, the case that the widths W2 of the reinforcing insulating layers 54*a* and 54*b* in the X direction are less than the width W1 of the third sub-wiring level layer 3Mx is shown in FIG. 2B. The reinforcing insulating layers 54*a* and 54*b* may improve the electrical insulation between the third sub-wiring level layer 3Mx and the second wiring level layer Mx+1 and between the seventh sub-wiring level layer 4Mx and the second wiring level layer Mx+1.

Figure 2C:
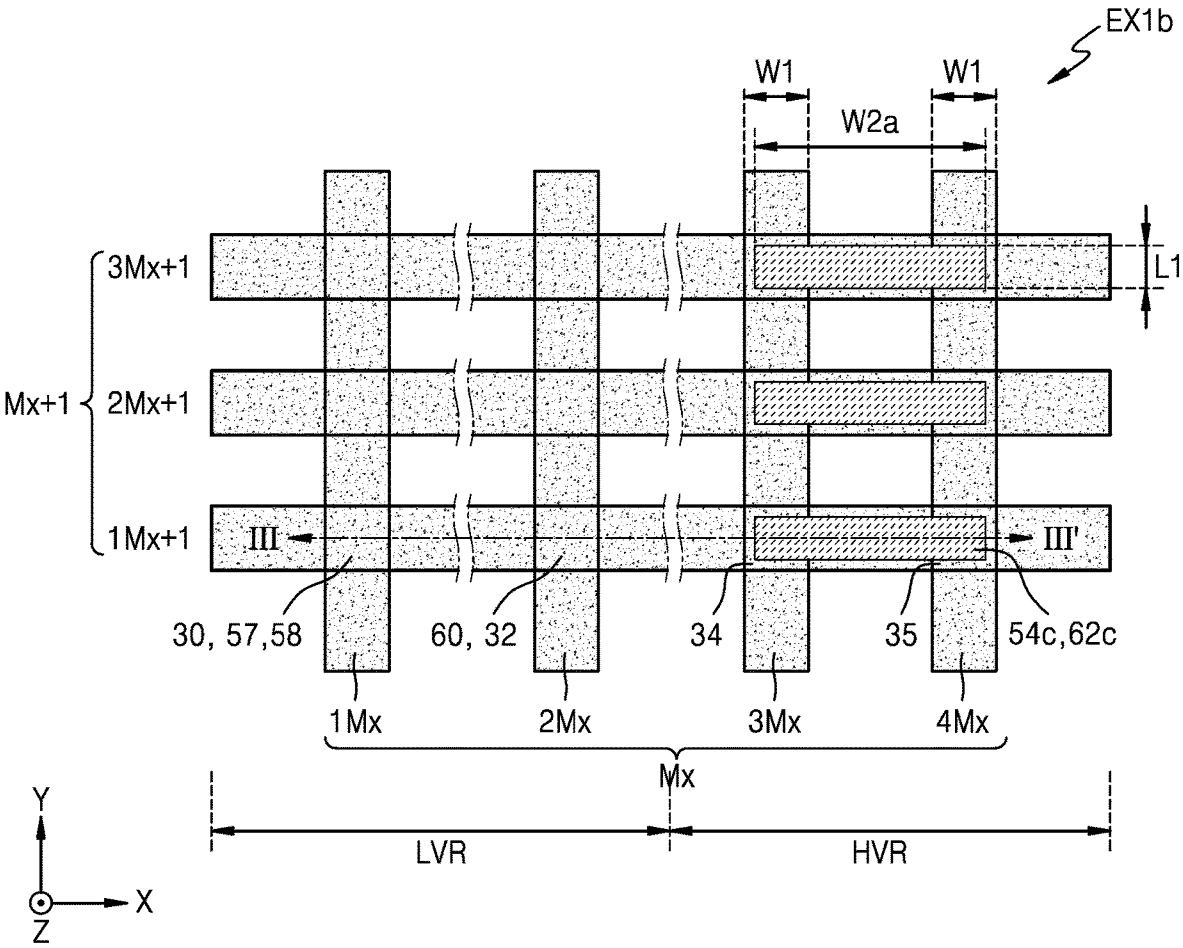
FIG. 2C is a layout showing upper and lower wiring layers and a via of a semiconductor device according to an embodiment.

FIG. 2C is a layout showing upper and lower wiring layers and a via of a semiconductor device according to an embodiment.

Specifically, the semiconductor device EX1*b* shown in FIG. 2C is another modification of the semiconductor device shown in FIG. 1 and FIG. 2A. The semiconductor device EX1*b* shown in FIG. 2C may have substantially the same structures as the semiconductor device EX1 shown in FIG. 1 and FIG. 2A, except that a seventh sub-wiring level layer 4Mx is further included and reinforcing insulating layers 54*a* and 54*b* extend in the X direction. In FIG. 2C, the same reference numeral denotes the same element in FIG. 1 and FIG. 2A, and the descriptions on the same elements may be briefly given or omitted.

The semiconductor device EX1*b* may include the first wiring level layer Mx and the second wiring level layer Mx+1. The second wiring level layer Mx+1 may be positioned over the first wiring level layer Mx. The first wiring level layer Mx may include the first sub-wiring level layer 1Mx, the second-wiring level layer 2Mx, the third sub-wiring level layer 3Mx, and a seventh sub-wiring level layer 4Mx.

The first sub-wiring level layer 1Mx and the second sub-wiring level layer 2Mx may be positioned in the low voltage region LVR in a plan view. The third sub-wiring level layer 3Mx and the seventh sub-wiring level layer 4Mx may be positioned in the high voltage region HVR in a plan view. The first wiring level layer Mx may include a first sub-wiring level layer 1Mx, a second-wiring level layer 2Mx, a third sub-wiring level layer 3Mx, and a seventh sub-wiring level layer 4Mx. The first sub-wiring level layer 1Mx, the second sub-wiring level layer 2Mx, the third sub-wiring level layer 3Mx, and the seventh sub-wiring level layer 4Mx may extend in the Y direction and be spaced apart from each other in the X direction.

The first wiring level layer Mx may extend in the Y direction and be spaced apart from each other in the X direction. The first wiring level layer Mx may include first to fourth lower wiring layers 30, 32, 34, and 35. The first to fourth lower wiring layers 30, 32, 34, and 35 may extend in the Y direction and be spaced apart from each other in the X direction.

The second wiring level layer Mx+1 may include the fourth sub-wiring level layer 1Mx+1, the fifth sub-wiring level layer 2Mx+1, and the sixth sub-wiring level layer 3Mx+1. The fourth to sixth sub-wiring level layers 1Mx+1, 2Mx+1, and 3Mx+1 may be positioned across the low voltage region LVR and the high voltage region HVR in a plan view. The fourth to sixth sub-wiring level layers 1Mx+1, 2Mx+1, and 3Mx+1 may extend in the Y direction and be spaced apart from each other in the X direction.

The second wiring level layer Mx+1 may extend in the X direction and may be spaced apart in the Y direction. The second wiring level layer Mx+1 may include first to third upper wiring layers 58, 60, and 62*c*. The first to third upper wiring layers 58, 60, and 62*c* may extend in the X direction and may be spaced apart from each other in the Y direction.

In the semiconductor device EX1*b*, the via 57 may be disposed at each cross point of the first wiring level layer Mx and the second wiring level layer Mx+1. In some embodiments, the via 57 may be positioned at the cross point of the first sub-wiring level layer 1Mx and the fourth sub-wiring level layer 1Mx+1.

In the semiconductor device EX1*b*, a reinforcing insulating layer 54*c* may be disposed at cross points and non-cross points of the first wiring level layer Mx and the second wiring level layer Mx+1. In some embodiments, the reinforcing insulating layer 54*c* may be formed between the first wiring level layer Mx and the second wiring level layer Mx+1. The reinforcing insulating layer 54*c* may be formed on the third sub-wiring level layer 3Mx and the seventh sub-wiring level layer 4Mx and extend in the X direction.

The reinforcing insulating layer 54*c* may have a width W2*a* in the X direction. The width W2*a* of the reinforcing insulating layer 54*c* in the X direction may be greater than the width W1 of the third sub-wiring level layer 3Mx and the seventh sub-wiring level layer 4Mx. The reinforcing insulating layer 54*c* may improve the electrical insulation between the third sub-wiring level layer 3Mx and the second wiring level layer Mx+1 and between the seventh sub-wiring level layer 4Mx and the second wiring level layer Mx+1.

Figure 2D:
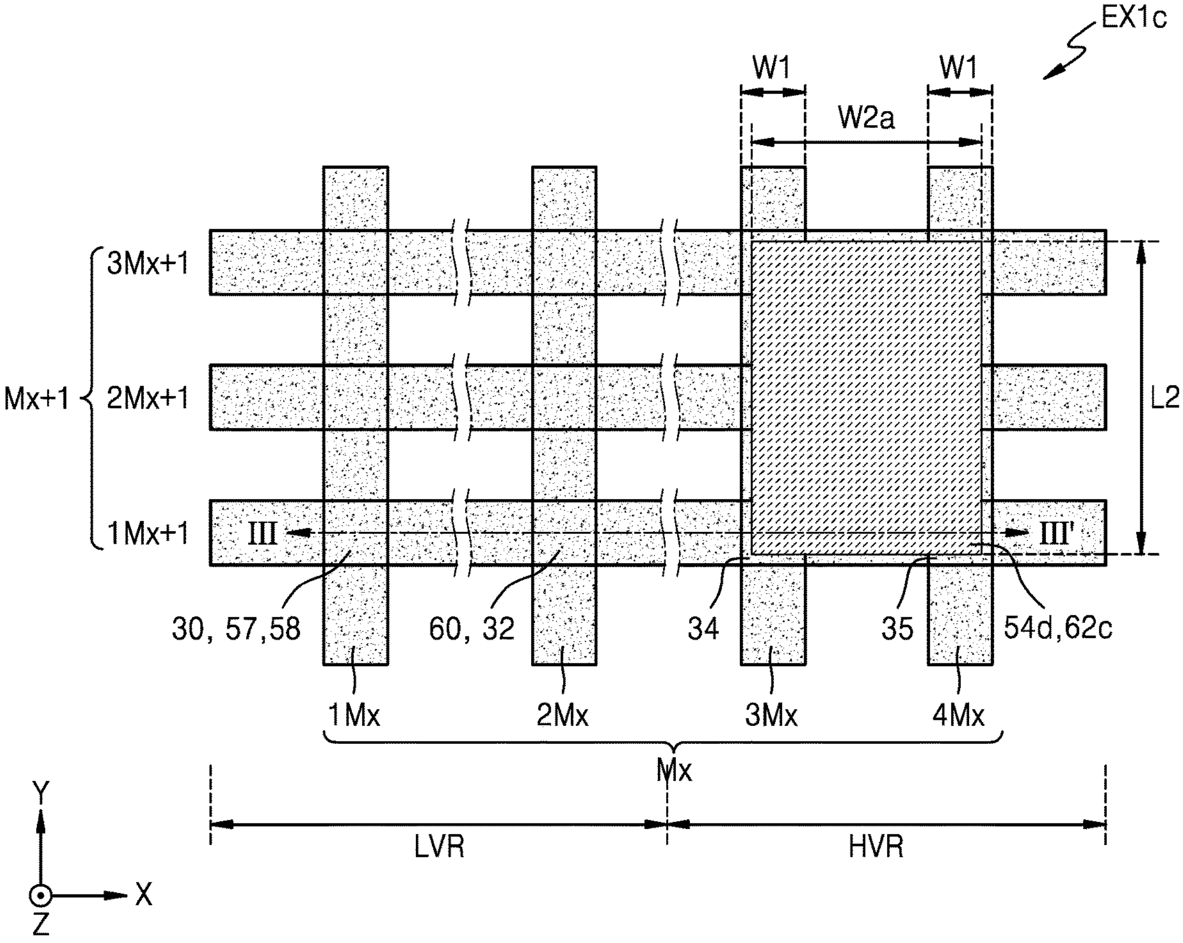
FIG. 2D is a layout showing upper and lower wiring layers and a via of a semiconductor device according to an embodiment.

FIG. 2D is a layout showing upper and lower wiring layers and a via of a semiconductor device according to an embodiment.

Specifically, the semiconductor device EX1*c* shown in FIG. 2D is another modification of the semiconductor device shown EX1 in FIG. 1 and FIG. 2A. The semiconductor device EX1*c* shown in FIG. 2C may have substantially the same structures as the semiconductor device EX1 shown in FIG. 1 and FIG. 2A, except that a seventh sub-wiring level layer 4Mx is further included and a reinforcing insulating layer 54*d* extends in the X direction and the Y direction. In FIG. 2D, the same reference numeral denotes the same element in FIG. 1 and FIG. 2A, and the descriptions on the same elements may be briefly given or omitted.

The semiconductor device EX1*c* may include the first wiring level layer Mx and the second wiring level layer Mx+1. The second wiring level layer Mx+1 may be positioned over the first wiring level layer Mx. The first wiring level layer Mx may include the first sub-wiring level layer 1Mx, the second-wiring level layer 2Mx, the third sub-wiring level layer 3Mx, and a seventh sub-wiring level layer 4Mx.

The first sub-wiring level layer 1Mx and the second sub-wiring level layer 2Mx may be positioned in the low voltage region LVR in a plan view. The third sub-wiring level layer 3Mx and the seventh sub-wiring level layer 4Mx may be positioned in the high voltage region HVR in a plan view. The first sub-wiring level layer 1Mx, the second sub-wiring level layer 2Mx, the third sub-wiring level layer 3Mx, and the seventh sub-wiring level layer 4Mx may extend in the Y direction and be spaced apart from each other in the X direction.

The first wiring level layer Mx may extend in the Y direction and be spaced apart from each other in the X direction. The first wiring level layer Mx may include first to fourth lower wiring layers 30, 32, 34, and 35. The first to fourth lower wiring layers 30, 32, 34, and 35 may extend in the Y direction and be spaced apart from each other in the X direction.

The second wiring level layer Mx+1 may include the fourth sub-wiring level layer 1Mx+1, the fifth sub-wiring level layer 2Mx+1, and the sixth sub-wiring level layer 3Mx+1. The fourth to sixth sub-wiring level layers 1Mx+1, 2Mx+1, and 3Mx+1 may be positioned across the low voltage region LVR and the high voltage region HVR in a plan view. The fourth to sixth sub-wiring level layers 1Mx+1, 2Mx+1, and 3Mx+1 may extend in the Y direction and be spaced apart from each other in the X direction.

The second wiring level layer Mx+1 may extend in the X direction and be spaced apart in the Y direction. The second wiring level layer Mx+1 may include first to third upper wiring layers 58, 60, and 62*c*. The first to third upper wiring layers 58, 60, and 62*c* may extend in the X direction and may be spaced apart from each other in the Y direction.

In the semiconductor device EX1*c*, the via 57 may be disposed at each cross point of the first wiring level layer Mx and the second wiring level layer Mx+1. In some embodiments, the via 57 may be positioned at the cross point of the first sub-wiring level layer 1Mx and the fourth sub-wiring level layer 1Mx+1.

In the semiconductor device EX1*b*, a reinforcing insulating layer 54*d* may be disposed at cross points and non-cross points of the first wiring level layer Mx and the second wiring level layer Mx+1. In some embodiments, the reinforcing insulating layer 54*d* may be formed between the first wiring level layer Mx and the second wiring level layer Mx+1. The reinforcing insulating layer 54*d* may be formed on the third sub-wiring level layer 3Mx and the seventh sub-wiring level layer 4Mx and extend in the Y direction.

The reinforcing insulating layer 54*d* may have a width W2*a* in the X direction. The reinforcing insulating layer 54*d* may have a length L2 in the Y direction. The width W2*a* of the reinforcing insulating layer 54*d* in the X direction may be greater than the width W1 of the third sub-wiring level layer 3Mx and the seventh sub-wiring level layer 4Mx. The reinforcing insulating layer 54*d* may improve the electrical insulation between the third sub-wiring level layer 3Mx and the second wiring level layer Mx+1 and between the seventh sub-wiring level layer 4Mx and the second wiring level layer Mx+1.

Figure 3A:
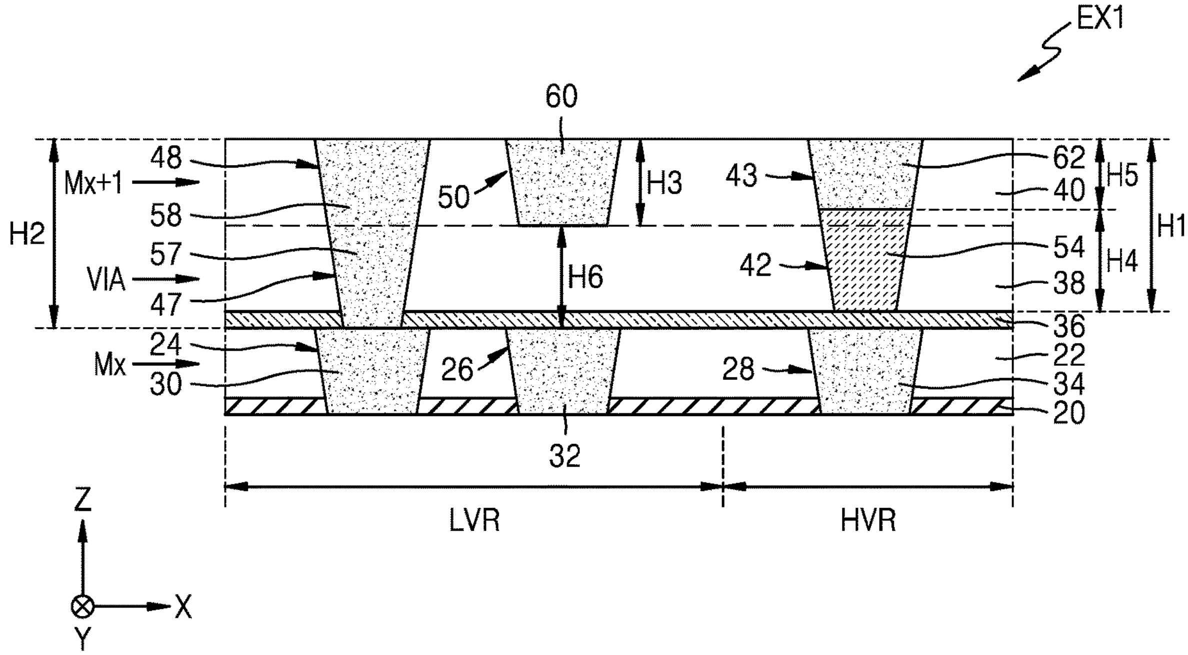
FIG. 3A is a cross-sectional view taken along line III-III' of FIG. 2A and illustrating a portion of the semiconductor device of FIG. 1.

FIG. 3A is a cross-sectional view taken along line III-III' of FIG. 2A and illustrating a portion of the semiconductor device of FIG. 1.

In FIG. 3A, the same reference numeral denotes the same element in FIG. 1 and FIG. 2A, and the descriptions on the same elements may be briefly given or omitted. The semiconductor device EX1 may include a first wiring level layer Mx, a second wiring level layer Mx+1, a via level layer VIA positioned between the first wiring level layer Mx and the second wiring level layer Mx+1, and a reinforcing insulating layer 54 to correspond to the via level layer VIA.

As described herein, the first wiring level layer Mx may include the first etch stopping layer 20, the first to third lower wiring layers 30, 32, and 34, and the first wiring insulating layer 22. The first and second lower wiring layers 30 and 32 may be positioned in the low voltage region LVR. The third lower wiring layer 34 may be positioned in the high voltage region HVR.

The first to third lower wiring layers 30, 32, and 34 may be collectively referred to as lower wiring layer. The first to third lower wiring layers 30, 32, and 34 may be buried in the first to third lower contact holes 24, 26, and 28 that may be provided in the first etch stopping layer 20 and the first wiring insulating layer 22.

As described herein, the second wiring level layer Mx+1 may include the first to third upper wiring layers 58, 60, and 62 and the second wiring insulating layer 40. The first and second upper wiring layers 58 and 60 may be positioned in the low voltage region LVR. The third upper wiring layer 62 may be positioned in the high voltage region HVR.

The first to third upper wiring layers 58, 60, and 62 may be collectively referred to as upper wiring layer. The first to third upper wiring layers 58, 60, and 62 may be buried in the first to third upper contact holes 48, 50, and 43 of the second wiring insulating layer 40, respectively.

The via level layer VIA may be positioned between the first wiring level layer Mx and the second wiring level layer Mx+1. The via level layer VIA may include the second etch stopping layer 36, the via 57, and the via insulating layer 38.

The via 57 may be buried in the via hole 47 through the second etch stopping layer 36 and the second via insulating layer 38. The reinforcing insulating layer 54 may be buried in the reinforced contact hole 42 of the via insulating layer 38 correspondently to the via level layer VIA.

An upper surface of the reinforcing insulating layer 54 may be positioned in the second wiring insulating layer 40. The reinforcing insulating layer 54 and the third upper wiring layer 62 may have a first height H1. The reinforcing insulating layer 54 may have a fourth height H4. The third upper wiring layer 62 may have a fifth height H5. The fourth height H4 of the reinforcing insulating layer 54 may correspond to a distance between the third upper wiring layer 62 and the second etch stopping layer 36 that is on the third lower wiring layer 34.

A total height of the via 57 and the first upper wiring layer 58 may be a second height H2. The first and second upper wiring layers 58 and 60 may have a third height H3. The via 57 may have a sixth height H6. The sixth height H6 of the via 57 may be a distance between the second lower wiring layer 32 and the second upper wiring layer 60. The first to sixth heights H1 to H6 may be several tens of nanometers, for example, about 10 nm to about 90 nm.

The upper surface of the reinforcing insulating layer 54 may have a height greater than or equal to a height of an upper surface of the via 57. Although the sixth height H6 of the via 57 may be lower than the upper surface of the reinforcing insulating layer 54, the reinforcing insulating layer 54 may be provided between the third upper wiring layer 62 and the third lower wiring layer 34 in the via level layer VIA, and the electrical insulation characteristic of the semiconductor device EX1 may be improved, and the leakage current may be reduced in the semiconductor device EX1.

Figure 3B:
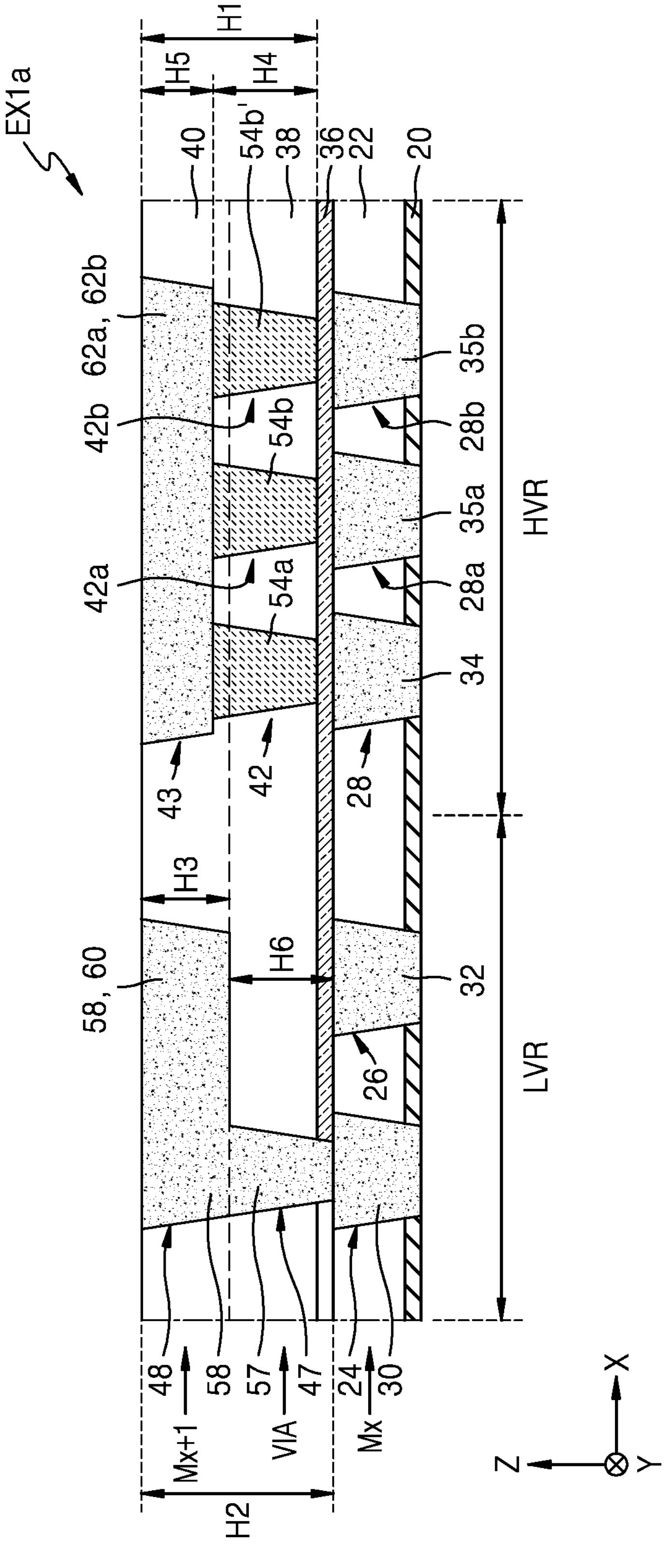
FIG. 3B is a cross-sectional view taken along line III-III' of FIG. 2B.

FIG. 3B is a cross-sectional view taken along line III-III' of FIG. 2B.

Specifically, the semiconductor device EX1*a* shown in FIG. 3B is a modification of the semiconductor device EX1 shown in FIG. 1, FIG. 2A and FIG. 3A. In FIG. 3B, the same reference numeral denotes the same element in FIG. 1, FIG. 2A, and FIG. 3A and the descriptions on the same elements may be briefly given or omitted.

The semiconductor device EX1*a* may include a first wiring level layer Mx, a second wiring level layer Mx+1, a via level layer VIA positioned between the first wiring level layer Mx and the second wiring level layer Mx+1, and a plurality of reinforcing insulating layers 54*a*, 54*b*, and 54*b*' to correspond to the via level layer VIA. While three reinforcing insulating layers 54*a*, 54*b* and 54*b*' are disclosed in the semiconductor device EX1*a* in FIG. 3B, two reinforcing insulating layers 54*a* and 54*b* may be included in the semiconductor device EX1*a*, as is disclosed with reference to FIG. 2B.

The first wiring level layer Mx may include the first etch stopping layer 20, first to fifth lower wiring layers 30, 32, 34, 35*a*, and 35*b*, and the first wiring insulating layer 22. The first and second lower wiring layers 30 and 32 may be positioned in the low voltage region LVR. The third to fifth lower wiring layers 34, 35*a*, and 35*b* may be positioned in the high voltage region HVR.

The first to fifth lower wiring layers 30, 32, 34, 35*a*, and 35*b* may be collectively referred to as lower wiring layer. The first to fifth lower wiring layers 30, 32, 34, 35*a*, and 35*b* may be buried in the first to fifth lower contact holes 24, 26, 28, 28*a*, and 28*b* that may be provided in the first etch stopping layer 20 and the first wiring insulating layer 22.

The second wiring level layer Mx+1 may include first to fourth upper wiring layers 58, 60, 62*a*, and 62*b* and the second wiring insulating layer 40. The first and second upper wiring layers 58 and 60 may be positioned in the low voltage region LVR. The first and second upper wiring layers 58 and 60 may be a single body having a larger width in the X direction. The third and fourth upper wiring layers 62*a* and 62*b* may be positioned in the high voltage region HVR. The third and fourth upper wiring layers 62*a* and 62*b* may be a single body having a larger width in the X direction.

The first to fourth upper wiring layers 58, 60, 62*a*, and 62*b* may be collectively referred to as upper wiring layer. The first to fourth upper wiring layers 58, 60, 62*a*, and 62*b* may be buried in the first and second upper contact holes 48 and 43 of the second wiring insulating layer 40, respectively.

The via level layer VIA may be positioned between the first wiring level layer Mx and the second wiring level layer Mx+1. The via level layer VIA may include the second etch stopping layer 36, the via 57, and the via insulating layer 38. The via 57 may be buried in the via hole 47 through the second etch stopping layer 36 and the second via insulating layer 38. The reinforcing insulating layers 54*a*, 54*b*, and 54*b*' may be buried in the reinforced contact holes 42, 42*a*, and 42*b* of the via insulating layer 38, respectively, correspondently to the via level layer VIA.

Upper surfaces of the reinforcing insulating layers 54*a*, 54*b*, and 54*b*' may be positioned in the second wiring insulating layer 40. The reinforcing insulating layers 54*a*, 54*b*, and 54*b*' and the third and fourth upper wiring layers 62*a* and 62*b* may have a first height H1. The reinforcing insulating layers 54*a*, 54*b*, and 54*b*' may have a fourth height H4. The third and fourth upper wiring layers 62*a* and 62*b* may have a fifth height H5. The fourth height H4 of the reinforcing insulating layers 54*a*, 54*b*, and 54*b*' may correspond to a distance between the third and fourth upper wiring layers 62*a* and 62*b* and the second etch stopping layer 36.

A total height of the via 57 and the first and second upper wiring layers 58 and 60 may be a second height H2. The first and second upper wiring layers 58 and 60 may have a third height H3. The via 57 may have a sixth height H6. The sixth height H6 of the via 57 may be a distance between the second lower wiring layer 32 and the second upper wiring layer 60. The first to sixth heights H1 to H6 may be several tens of nanometers, for example, about 10 nm to about 90 nm.

The upper surfaces of the reinforcing insulating layers 54*a*, 54*b*, and 54*b*' may have a height greater than or equal to a height of an upper surface of the via 57. Although the sixth height H6 of the via 57 may be lower than the upper surface of the reinforcing insulating layers 54*a*, 54*b*, and 54*b*', the reinforcing insulating layers 54*a*, 54*b*, and 54*b*' may be provided between the third and fourth upper wiring layers 62*a* and 62*b* and the third to fifth lower wiring layers 34, 35*a*, and 35*b* in the via level layer VIA, and the electrical insulation characteristic of the semiconductor device EX1*a* may be improved and the leakage current may be reduced in the semiconductor device EX1*a*.

Figure 3C:
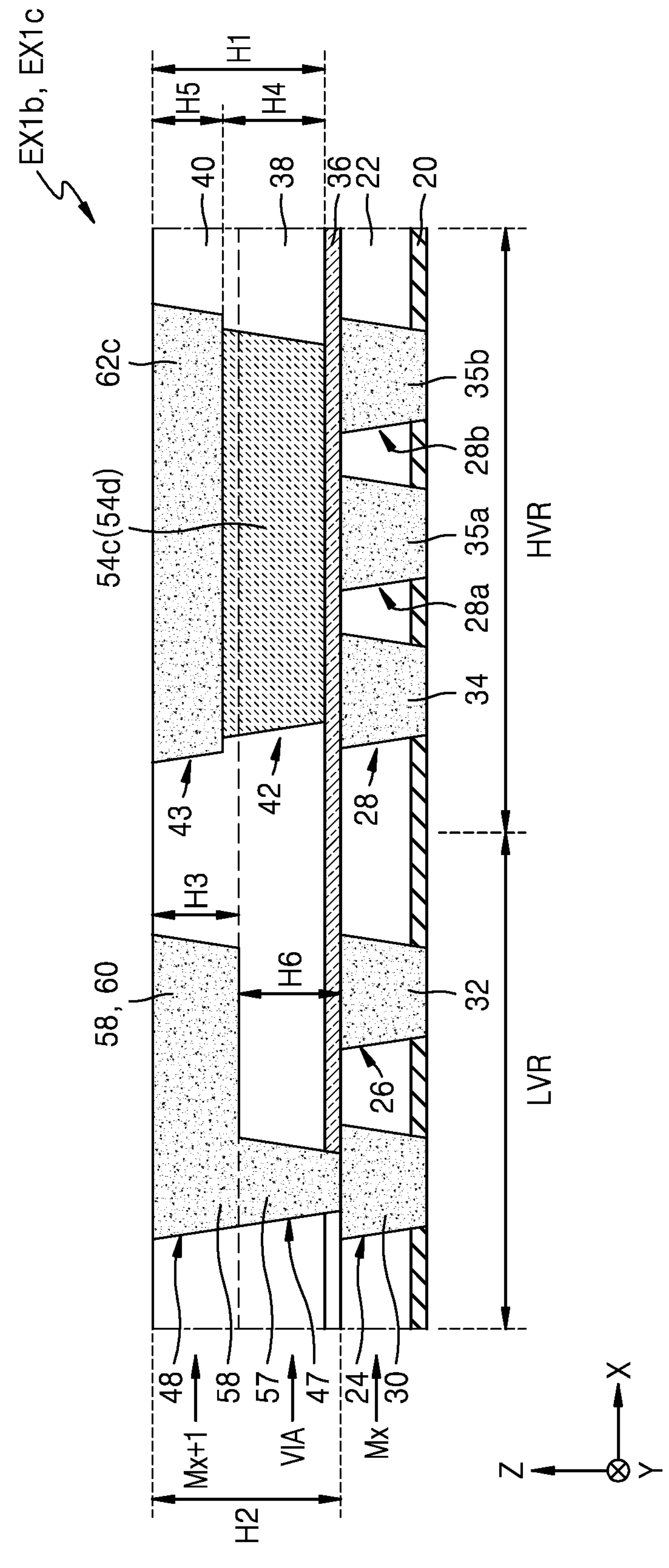
FIG. 3C is a cross-sectional view taken along line III-III' of FIG. 2C and FIG. 2D.

FIG. 3C is a cross-sectional view taken along line III-III' of FIG. 2C and FIG. 2D.

Specifically, the semiconductor device EX1*b* or EX1*c* shown in FIG. 3C is another modification of the semiconductor device EX1 shown in FIG. 1, FIG. 2A and FIG. 3A. In FIG. 3C, the same reference numeral denotes the same element in FIG. 1, FIG. 2A, and FIG. 3A and the descriptions on the same elements may be briefly given or omitted.

The semiconductor device EX1*b* or EX1*c* may include a first wiring level layer Mx, a second wiring level layer Mx+1, a via level layer VIA positioned between the first wiring level layer Mx and the second wiring level layer Mx+1, and a plurality of reinforcing insulating layers 54*c* or 54*d* to correspond to the via level layer VIA.

The first wiring level layer Mx may include the first etch stopping layer 20, first to fifth lower wiring layers 30, 32, 34, 35*a*, and 35*b*, and the first wiring insulating layer 22. The first and second lower wiring layers 30 and 32 may be positioned in the low voltage region LVR. The third to fifth lower wiring layers 34, 35*a*, and 35*b* may be positioned in the high voltage region HVR.

The first to fifth lower wiring layers 30, 32, 34, 35*a*, and 35*b* may be collectively referred to as lower wiring layer. The first to fifth lower wiring layers 30, 32, 34, 35*a*, and 35*b* may be buried in the first to fifth lower contact holes 24, 26, 28, 28*a*, and 28*b* that may be provided in the first etch stopping layer 20 and the first wiring insulating layer 22.

The second wiring level layer Mx+1 may include first to third upper wiring layers 58, 60, and 62*c* and the second wiring insulating layer 40. The first and second upper wiring layers 58 and 60 may be positioned in the low voltage region LVR. The first and second upper wiring layers 58 and 60 may be a single body having a larger width in the X direction. The third upper wiring layer 62*c* may be positioned in the high voltage region HVR. The third upper wiring layer 62*c* may be a single body having a larger width in the X direction.

The first to third upper wiring layers 58, 60, and 62*c* may be collectively referred to as upper wiring layer. The first to third upper wiring layers 58, 60, and 62*c* may be buried in the first and second upper contact holes 48 and 43 of the second wiring insulating layer 40, respectively.

The via level layer VIA may be positioned between the first wiring level layer Mx and the second wiring level layer Mx+1. The via level layer VIA may include the second etch stopping layer 36, the via 57, and the via insulating layer 38. The via 57 may be buried in the via hole 47 through the second etch stopping layer 36 and the second via insulating layer 38. The reinforcing insulating layers 54*c* and 54*d* may be buried in the reinforced contact hole 42 of the via insulating layer 38 correspondently to the via level layer VIA.

Upper surfaces of the reinforcing insulating layers 54*c* and 54*d* may be positioned in the second wiring insulating layer 40. The reinforcing insulating layers 54*c* and 54*d* and the third upper wiring layer 62*c* may have a first height H1. The reinforcing insulating layers 54*c* and 54*d* may have a fourth height H4. The third upper wiring layer 62*c* may have a fifth height H5. The fourth height H4 of the reinforcing insulating layers 54*c* and 54*d* may correspond to a distance between the third upper wiring layer 62*c* and the second etch stopping layer 36.

A total height of the via 57 and the first and second upper wiring layers 58 and 60 may be a second height H2. The first and second upper wiring layers 58 and 60 may have a third height H3. The via 57 may have a sixth height H6. The sixth height H6 of the via 57 may be a distance between the second lower wiring layer 32 and the second upper wiring layer 60. The first to sixth heights H1 to H6 may be several tens of nanometers, for example, about 10 nm to about 90 nm.

The upper surfaces of the reinforcing insulating layers 54*c* and 54*d* may have a height greater than or equal to a height of an upper surface of the via 57. Although the sixth height H6 of the via 57 may be lower than the upper surfaces of the reinforcing insulating layers 54*c* and 54*d*, the reinforcing insulating layers 54*c* and 54*d* may be provided between the third upper wiring layer 62*c* and the third to fifth lower wiring layers 34, 35*a*, and 35*b* in the via level layer VIA, and the electrical insulation characteristic of the semiconductor device EX1*a* or EX1*b* may be improved and the leakage current may be reduced in the semiconductor device EX1*b* or EX1*c*.

Figure 4:
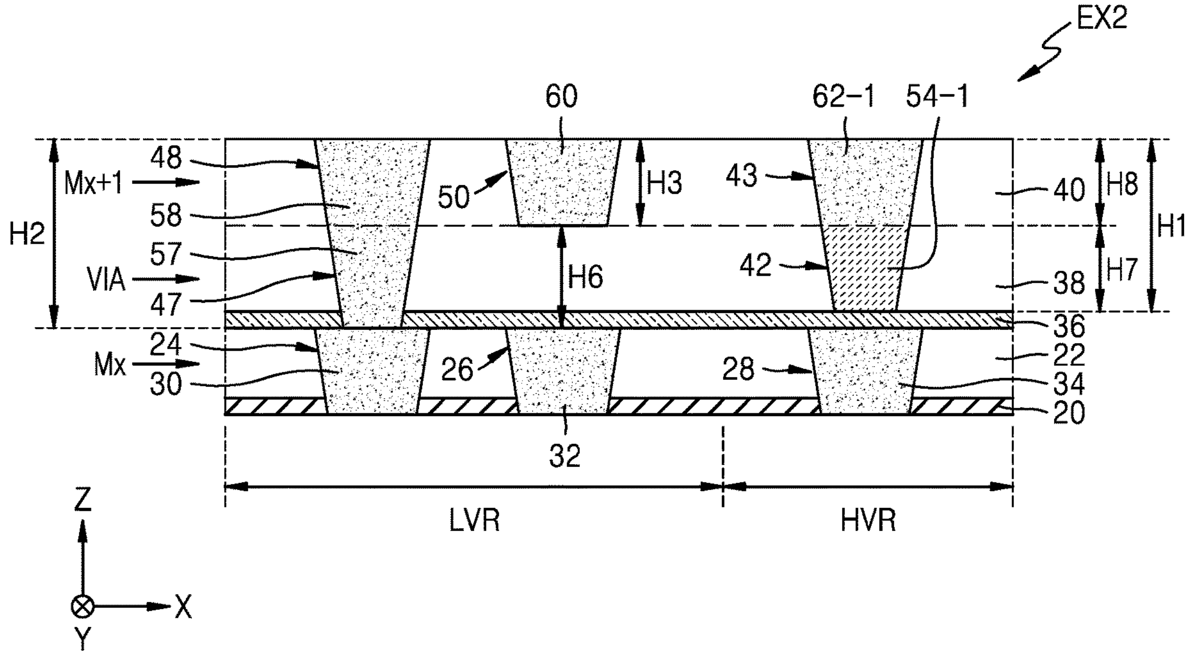
FIG. 4 is a cross-sectional view illustrating a semiconductor device according to an embodiment.

FIG. 4 is a cross-sectional view illustrating a semiconductor device according to an embodiment.

A semiconductor device EX2 in FIG. 4 may have substantially the same structures as the semiconductor device EX1 in FIGS. 3A to 3C, except for the height H7 of the reinforcing insulating layer 54-1 and the height H8 of the third upper wiring layer 62-1. In FIG. 4, the same reference numeral denotes the same element in FIG. 1, FIGS. 2A to 2D, and FIGS. 3A to 3C, and the descriptions on the same elements may be briefly given or omitted.

The semiconductor device EX2 may include the first wiring level layer Mx, the second wiring level layer Mx+1, the via level layer VIA between the first wiring level layer Mx and the second wiring level layer Mx+1, and the reinforcing insulating layer 54-1 correspondently to the via level layer VIA.

The first wiring level layer Mx may include the first etch stopping layer 20, the first to third lower wiring layers 30, 32, and 34, and the first wiring insulating layer 22. The first and second lower wiring layers 30 and 32 may be positioned in the low voltage region LVR. The third lower wiring layer 34 may be positioned in the high voltage region HVR. The first to third lower wiring layers 30, 32, and 34 may be buried in the first to third lower contact holes 24, 26, and 28 that may be provided in the first etch stopping layer 20 and the first wiring insulating layer 22.

The second wiring level layer Mx+1 may include first to third upper wiring layers 58, 60, and 62-1 and the second wiring insulating layer 40. The first and second upper wiring layers 58 and 60 may be positioned in the low voltage region LVR. The third upper wiring layer 62-1 may be positioned in the high voltage region HVR. The first to third upper wiring layers 58, 60, and 62-1 may be buried in first to third upper contact holes 48, 50, and 43 of the second wiring insulating layer 40, respectively.

The via level layer VIA may be positioned between the first wiring level layer Mx and the second wiring level layer Mx+1. The via level layer VIA may include the second etch stopping layer 36, the via 57, and the via insulating layer 38. The via 57 may be buried in the via hole 47 through the second etch stopping layer 36 and the second via insulating layer 38. The reinforcing insulating layer 54-1 may be buried in the reinforced contact hole 42 of the via insulating layer 38 correspondently to the via level layer VIA.

An upper surface of the reinforcing insulating layer 54-1 may be the same as that of the via 57. The upper surface of the reinforcing insulating layer 54-1 may be the same as the lower surface of the second wiring insulating layer 40. The reinforcing insulating layer 54-1 and the third upper wiring layer 62-1 may have a first height H1. The reinforcing insulating layer 54-1 may have a seventh height H7. The third upper wiring layer 62-1 may have an eighth height H8. The eighth height H8 of the third upper wiring layer 62-1 may be the same as the third height H3 of the first and second upper wiring layers 58 and 60. The seventh height H7 of the reinforcing insulating layer 54-1 may correspond to a distance between the third upper wiring layer 62 and the second etch stopping layer 36 that is on the third lower wiring layer 34.

The total height of the via 57 and the first upper wiring layer 58 may be the second height H2. The first and second upper wiring layers 58 and 60 may have the third height H3. The via 57 may have the sixth height H6. The sixth height H6 of the via 57 may correspond to a distance between the second lower wiring layer 32 and the second upper wiring layer 60. The first to eighth heights H1 to H8 may be several tens of nanometers, for example, about 10 nm to about 90 nm.

Although the sixth height H6 of the via 57 may be decreased and the upper surface of the reinforcing insulating layer 54-1 may have a same height as an upper surface of the via 57, the reinforcing insulating layer 54-1 may be provided between the third upper wiring layer 62-1 and the third lower wiring layer 34 in the via level layer VIA, and the electrical insulation characteristic of the semiconductor device EX2 may be improved, and the leakage current may be reduced in the semiconductor device EX2.

Figure 5:
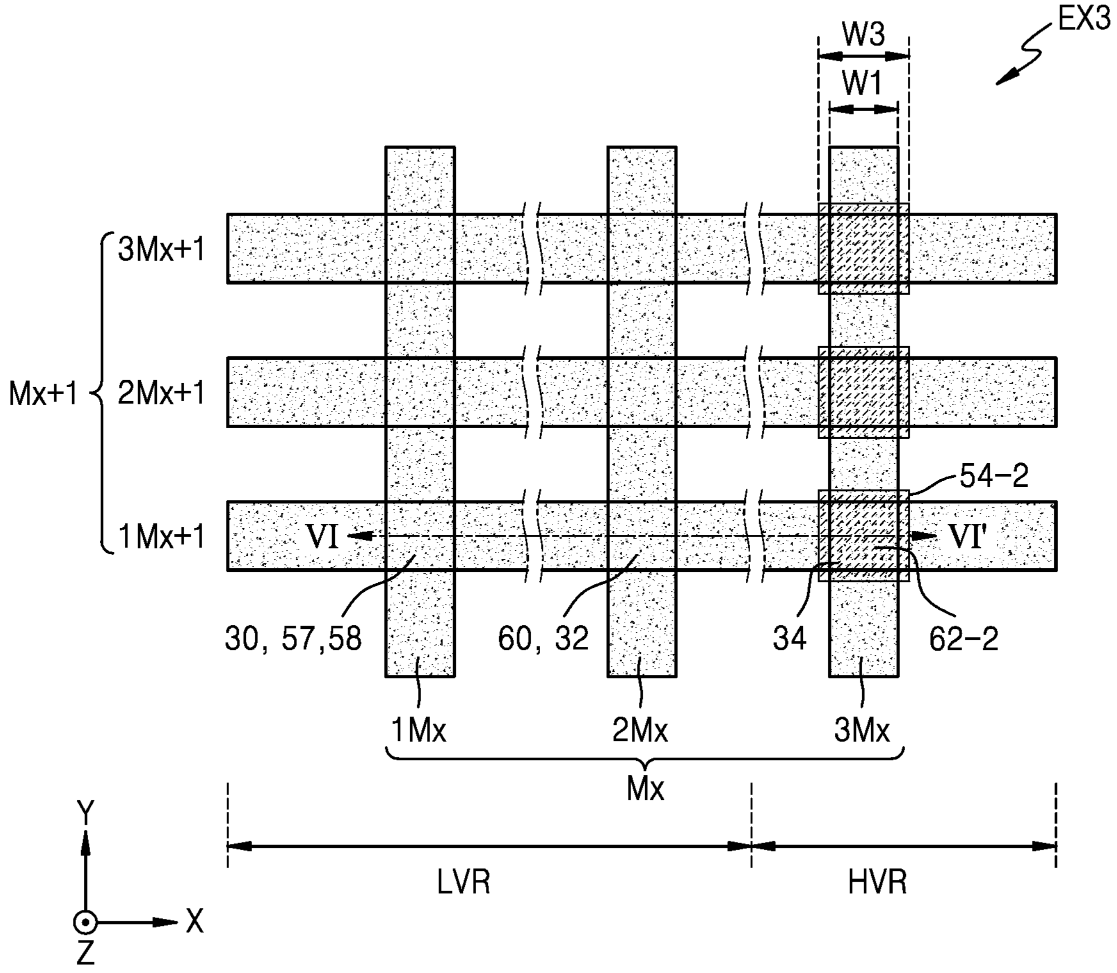
FIG. 5 is a layout showing upper and lower wiring layers and a via of the semiconductor device according to an embodiment.

FIG. 5 is a layout showing upper and lower wiring layers and a via of a semiconductor device, according to an embodiment.

Specifically, the semiconductor device EX3 in FIG. 5 may have the same structures as the semiconductor device EX2 in FIGS. 2A to 2D, except for the arrangement of the reinforcing insulating layer 54-2. In FIG. 5, the same reference numeral denotes the same element in FIG. 1, FIGS. 2A to 2D, and FIGS. 3A to 3C, and the descriptions on the same elements may be briefly given or omitted. The semiconductor device EX3 may include the first wiring level layer Mx and the second wiring level layer Mx+1. The second wiring level layer Mx+1 may be positioned over the first wiring level layer Mx.

The first wiring level layer Mx may include the first sub-wiring level layer 1Mx, the second sub-wiring level layer 2Mx, and the third sub-wiring level layer 3Mx. The first sub-wiring level layer 1Mx and the second sub-wiring level layer 2Mx may be positioned in the low-voltage region LVR in a plan view. The third sub-wiring level layer 3Mx may be positioned in the high voltage region HVR in a plan view.

The first to third sub-wiring level layers 1Mx, 2Mx, and 3Mx may extend in the Y direction and may be spaced apart from each other in the X direction. The first wiring level layer Mx may extend in the Y direction and may be spaced apart from each other in the X direction. The first wiring level layer Mx may include the first to third lower wiring layers 30, 32, and 34. The first to third lower wiring layers 30, 32, and 34 may extend in the Y direction and may be spaced apart from each other in the X direction.

The second wiring level layer Mx+1 may include the fourth sub-wiring level layer 1Mx+1, the fifth sub-wiring level layer 2Mx+1, and the sixth sub-wiring level layer 3Mx+1. The fourth to sixth sub-wiring level layers 1Mx+1, 2Mx+1, and 3Mx+1 may be positioned across the low voltage region LVR and the high voltage region HVR in a plan view. The fourth to sixth sub-wiring level layers 1Mx+1, 2Mx+1, and 3Mx+1 may extend in the Y direction and may be spaced apart from each other in the X direction.

The second wiring level layer Mx+1 may extend in the X direction and may be spaced apart in the Y direction. The second wiring level layer Mx+1 may include first to third upper wiring layers 58, 60, and 62-2. The first to third upper wiring layers 58, 60, and 62-2 may extend in the X direction and may be spaced apart from each other in the Y direction.

In the semiconductor device EX3, the via 57 may be arranged at each cross point of the first wiring level layer Mx and the second wiring level layer Mx+1. In an embodiment, the via 57 may be positioned at the cross point of the first sub-wiring level layer 1Mx and the fourth sub-wiring level layer 1Mx+1.

In the semiconductor device EX3, the reinforcing insulating layer 54-2 may be arranged at each cross point of the first wiring level layer Mx and the second wiring level layer Mx+1. In some embodiments, the reinforcing insulating layer 54-2 may be positioned at the cross points of the third sub-wiring level layer 3Mx and the fourth sub-wiring level layer 1Mx+1, of the third sub-wiring level layer 3Mx and the fifth sub-wiring level layer 2Mx+1, and of the third sub-wiring level layer 3Mx and the sixth sub-wiring level layer 3Mx+1.

The width W3 of the reinforcing insulating layer 54-2 in the X direction may be greater than the width W1 of the third sub-wiring level layer 3Mx. The reinforcing insulating layer 54-2 may improve the electrical insulation between the third sub-wiring level layer 3Mx and the second wiring level layer Mx+1.

Figure 6:
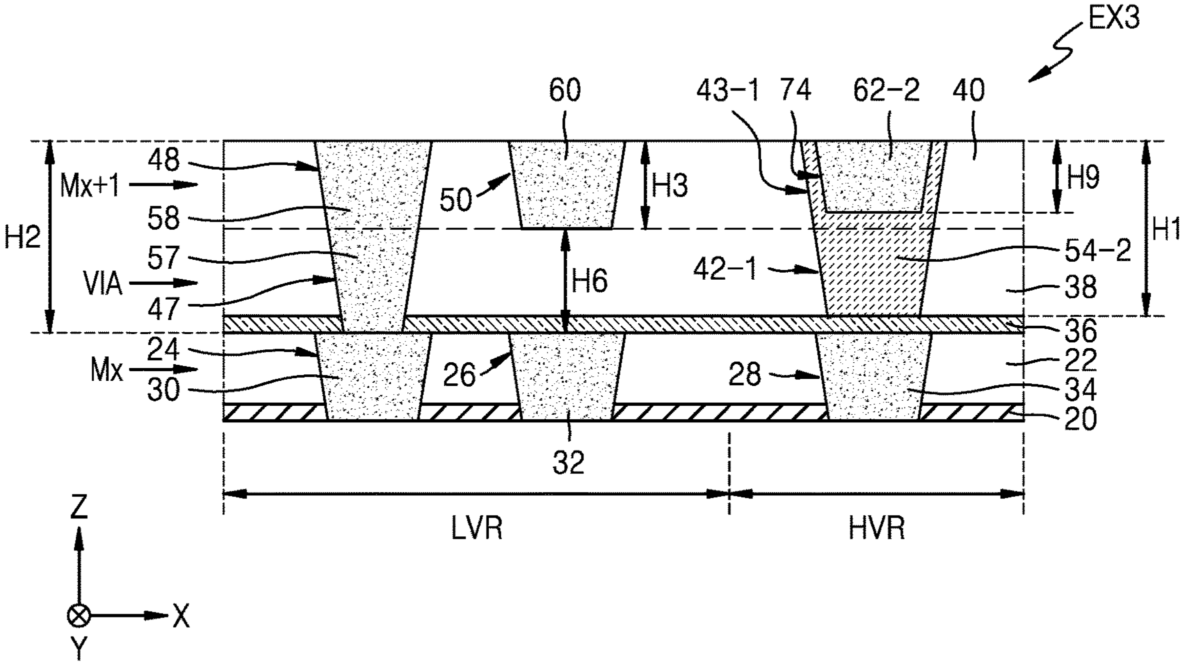
FIG. 6 is a cross-sectional view of the semiconductor device taken along line VI-VI' of FIG. 5.

FIG. 6 is a cross-sectional view of the semiconductor device taken along line VI-VI' of FIG. 5.

In FIG. 6, the same reference numeral denotes the same element in FIG. 1, FIGS. 2A to 2D, and FIGS. 3A to 3C, and the descriptions on the same elements may be briefly given or omitted. The semiconductor device EX3 may include the first wiring level layer Mx, the second wiring level layer Mx+1, the via level layer VIA between the first wiring level layer Mx and the second wiring level layer Mx+1, and the reinforcing insulating layer 54-2 disposed at the via level layer VIA.

The first wiring level layer Mx may include the first etch stopping layer 20, the first to third lower wiring layers 30, 32, and 34, and the first wiring insulating layer 22. The first and second lower wiring layers 30 and 32 may be positioned in the low voltage region LVR. The third lower wiring layer 34 may be positioned in the high voltage region HVR.

The first to third lower wiring layers 30, 32, and 34 may be collectively referred to as lower wiring layers. The first to third lower wiring layers 30, 32, and 34 may be buried in the first to third lower contact holes 24, 26, and 28 that may be provided in the first etch stopping layer 20 and the first wiring insulating layer 22.

The second wiring level layer Mx+1 may include the first to third upper wiring layers 58, 60, and 62-2 and the second wiring insulating layer 40. The first and second upper wiring layers 58 and 60 may be positioned in the low voltage region LVR. The third upper wiring layer 62-2 may be positioned in the high voltage region HVR.

The first to third upper wiring layers 58, 60, and 62-2 may be collectively referred to as upper wiring layers. The first to third upper wiring layers 58, 60, and 62-2 may be buried in first to third upper contact holes 48, 50, and 74 of the second wiring insulating layer 40, respectively.

The via level layer VIA may be positioned between the first wiring level layer Mx and the second wiring level layer Mx+1. The via level layer VIA may include the second etch stopping layer 36, the via 57, and the via insulating layer 38. The via 57 may be buried in the via hole 47 through the second etch stopping layer 36 and the second via insulating layer 38. For example, the via 57 in the via hole 47 may penetrate the second etch stopping layer 36 and the second via insulating layer 38.

The reinforcing insulating layer 54-2 may be positioned in reinforced contact holes 42-1 and 43-1 through the via insulating layer 38 and the second wiring insulating layer 40 correspondently to the via level layer VIA. The reinforced contact holes 42-1 and 43-1 may include a first reinforced contact hole 42-1 through the via insulating layer 38 and a second reinforced contact hole 43-1 through the second wiring insulating layer 40.

The first reinforced contact hole 42-1 may have a width greater than a width of the reinforced contact hole 42 shown in FIG. 3. The second reinforced contact hole 43-1 may have a width greater than a width of the third upper contact hole 43 shown in FIG. 3. Accordingly, the reinforcing insulating layer 54-2 may enclose the third upper wiring layer 62-2. An upper surface of the reinforcing insulating layer 54-2 may be coplanar with an upper surface of the second wiring insulating layer 40. A lower surface of the third upper wiring layer 62-2 may be positioned higher than an upper surface of the via insulating layer 38.

The reinforcing insulating layer 54-2 may have a first height H1. The third upper wiring layer 62-2 may have a ninth height H9. The first height H1 of the reinforcing insulating layer 54-2 may correspond to a distance between an upper surface of the second wiring insulating layer 40 and an upper surface of the second etch stopping layer 36 positioned on the third lower wiring layer 34.

The total height of the via 57 and the first upper wiring layer 58 may be the second height H2. The first and second upper wiring layers 58 and 60 may have the third height H3. The via 57 may have the sixth height H6. The sixth height H6 of the via 75 may correspond to a distance between the second lower wiring layer 32 and the second upper wiring layer 60. The first to ninth heights H1 to H9 may be several tens of nanometers, for example, about 10 nm to about 90 nm.

Although the sixth height H6 of the via 57 may be decreased and the upper surface of the reinforcing insulating layer 54-2 may have a height greater than a height of an upper surface of the via 57, the reinforcing insulating layer 54-2 may be provided between the third upper wiring layer 62-2 and the third lower wiring layer 34 in the via level layer VIA, and the electrical insulation characteristic of the semiconductor device EX3 may be improved, and the leakage current may be reduced in the semiconductor device EX3. Particularly, the reinforcing insulating layer 54-2 may be provided in such a configuration that the third upper wiring layer 62-2 is enclosed by the reinforcing insulating layer 54-2, and thus the electrical insulation between the third upper wiring layer 62-2 and the third lower wiring layer 34 may be further improved in the semiconductor device EX3.

Figure 7:
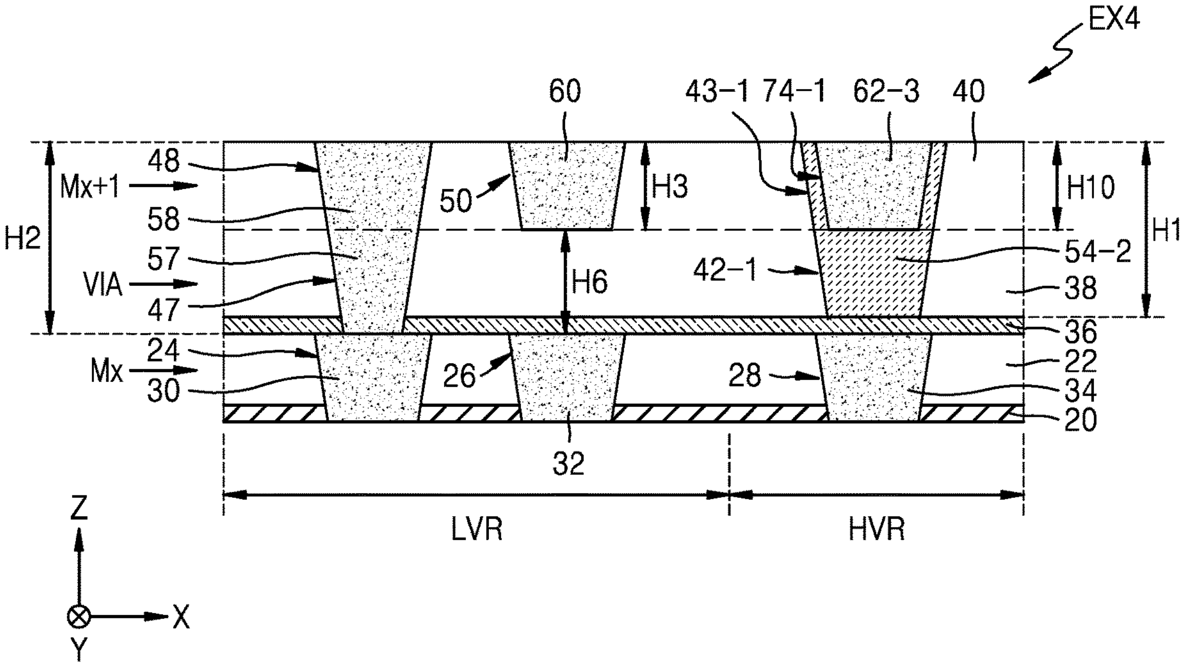
FIG. 7 is a cross-sectional view illustrating a semiconductor device according to an embodiment.

FIG. 7 is a cross-sectional view illustrating a semiconductor device, according to an embodiment.

Specifically, a semiconductor device EX4 in FIG. 7 may have substantially the same structures as the semiconductor device EX3 in FIG. 6, except for a height H10 of a third upper wiring layer 62-3 that is different from the height H9 of the third upper wiring layer 62-2. In FIG. 7, the same reference numeral denotes the same element in FIG. 5 and FIG. 6, and the descriptions on the same elements may be briefly given or omitted.

The semiconductor device EX4 may include the first wiring level layer Mx, the second wiring level layer Mx+1, the via level layer VIA between the first wiring level layer Mx and the second wiring level layer Mx+1, and the reinforcing insulating layer 54-2 disposed at the via level layer VIA.

The first wiring level layer Mx may include the first etch stopping layer 20, the first to third lower wiring layers 30, 32, and 34, and the first wiring insulating layer 22. The first and second lower wiring layers 30 and 32 may be positioned in the low voltage region LVR. The third lower wiring layer 34 may be positioned in the high voltage region HVR.

The first to third lower wiring layers 30, 32, and 34 may be buried in the first to third lower contact holes 24, 26, and 28 that may be provided in the first etch stopping layer 20 and the first wiring insulating layer 22.

The second wiring level layer Mx+1 may include first to third upper wiring layers 58, 60, and 62-3 and the second wiring insulating layer 40. The first and second upper wiring layers 58 and 60 may be positioned in the low voltage region LVR. The third upper wiring layer 62-3 may be positioned in the high voltage region HVR. The first to third upper wiring layers 58, 60, and 62-3 may be buried in first to third upper contact holes 48, 50, and 74-1 of the second wiring insulating layer 40, respectively.

The via level layer VIA may be positioned between the first wiring level layer Mx and the second wiring level layer Mx+1. The via level layer VIA may include the second etch stopping layer 36, the via 57, and the via insulating layer 38. The via 57 may be buried in the via hole 47 through the second etch stopping layer 36 and the second via insulating layer 38.

The reinforcing insulating layer 54-2 may be positioned in the reinforced contact holes 42-1 and 43-1 through the via insulating layer 38 and the second wiring insulating layer 40 correspondently to the via level layer VIA. The reinforced contact holes 42-1 and 43-1 may include the first reinforced contact hole 42-1 through the via insulating layer 38 and the second reinforced contact hole 43-1 through the second wiring insulating layer 40.

The first reinforced contact hole 42-1 may have a width greater than a width of the reinforced contact hole 42 shown in FIG. 3. The second reinforced contact hole 43-1 may have a width greater than a width of the third upper contact hole 43 shown in FIG. 3. Accordingly, the reinforcing insulating layer 54-2 may enclose the third upper wiring layer 62-3. For example, the reinforcing insulating layer 54-2 may enclose a bottom surface and a sidewall surface of the third upper wiring layer 62-3. An upper surface of the reinforcing insulating layer 54-2 may be coplanar with an upper surface of the second wiring insulating layer 40. A lower surface of the third upper wiring layer 62-3 may be coplanar with an upper surface of the via insulating layer 38.

The reinforcing insulating layer 54-2 may have the first height H1. The third upper wiring layer 62-3 may have a tenth height H10. The first height H1 of the reinforcing insulating layer 54-2 may correspond to a distance between the upper surface of the second wiring insulating layer 40 and the second etch stopping layer 36 on the third lower wiring layer 34.

The total height of the via 57 and the first upper wiring layer 58 may be the second height H2. The first and second upper wiring layers 58 and 60 may have the third height H3. The via 57 may have the sixth height H6. The sixth height H6 of the via 75 may correspond to a distance between the second lower wiring layer 32 and the second upper wiring layer 60. The first to tenth heights H1 to H10 may be several tens of nanometers, for example, about 10 nm to about 90 nm.

Although the sixth height H6 of the via 57 may be decreased and the upper surface of the reinforcing insulating layer 54-2 may have a height greater than a height of an upper surface of the via 57, the reinforcing insulating layer 54-2 may be provided between the third upper wiring layer 62-3 and the third lower wiring layer 34 in the via level layer VIA, and the electrical insulation characteristic of the semiconductor device EX4 may be improved, and the leakage current may be reduced in the semiconductor device EX4. Particularly, the reinforcing insulating layer 54-2 may be provided in such a configuration that a portion of the third upper wiring layer 62-2 may be enclosed by the reinforcing insulating layer 54-2, and the electrical insulation between the third upper wiring layer 62-2 and the third lower wiring layer 34 may be further improved in the semiconductor device EX4. For example, the reinforcing insulating layer 54-2 may enclose a bottom surface and a sidewall surface of the third upper wiring layer 62-2.

FIG. 8, FIG. 9, FIG. 10, FIG. 11, FIG. 12, and FIG. to 13 are cross-sectional views illustrating a method of manufacturing the semiconductor device shown in FIG. 3.

Figure 8:
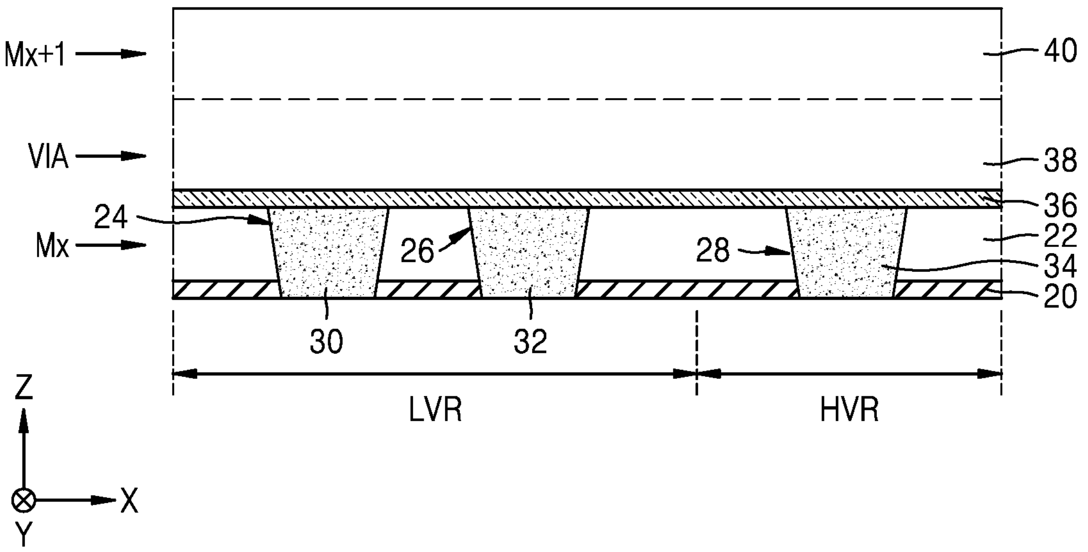
FIG. 8, FIG. 9, FIG. 10, FIG. 11, FIG. 12, and FIG. 13 are cross-sectional views illustrating a method of manufacturing the semiconductor device shown in FIG. 3.

In FIGS. 8 to 13, the same reference numerals denote the same elements in FIG. 3, and the descriptions on the same elements may be briefly given or omitted. Referring to FIG. 8, a first wiring level layer Mx may be formed on a semiconductor substrate 10 in FIG. 1 having a low voltage region LVR and a high voltage region HVR. The first wiring level layer Mx may include a first etch stopping layer 20, first to third lower wiring layers 30, 32, and 34, and a first wiring insulating layer 22.

The first etch stopping layer 20 may be formed of a material having an etching selectivity with respect to the first wiring insulating layer 22. The first etch stopping layer 20 may be formed into a silicon nitride layer. The first wiring insulating layer 22 may be formed into a silicon oxide layer.

The first to third lower wiring layers 30, 32, and 34 may be formed into a metal layer, for example, a copper layer, an aluminum layer, or a tungsten layer. The first to third lower wiring layers 30, 32, and 34 may be formed in first to third lower contact holes 24, 26, and 28, respectively, that may be provided in the first etch stopping layer 20 and the first wiring insulating layer 22. The first and second lower wiring layers 30 and 32 may be positioned in the low voltage region LVR. The third lower wiring layer 34 may be positioned in the high voltage region HVR. In some embodiments, upper widths of the first to third lower wiring layers 30, 32, and 34 may be greater than lower widths thereof.

A second etch stopping layer 36, a via insulating layer 38, and a second wiring insulating layer 40 may be sequentially formed on the first wiring level layer Mx. The second etch stopping layer 36 may be formed of a material having an etching selectivity with respect to the via insulating layer 38. The second etch stopping layer 36 may be formed into a silicon nitride layer. The via insulating layer 38 may be formed into a silicon oxide layer. A via level layer VIA may be formed in the via insulating layer 38 in subsequent processes. A second wiring level layer Mx+1 may be formed in the second wiring insulating layer 40 in subsequent processes.

Figure 9:
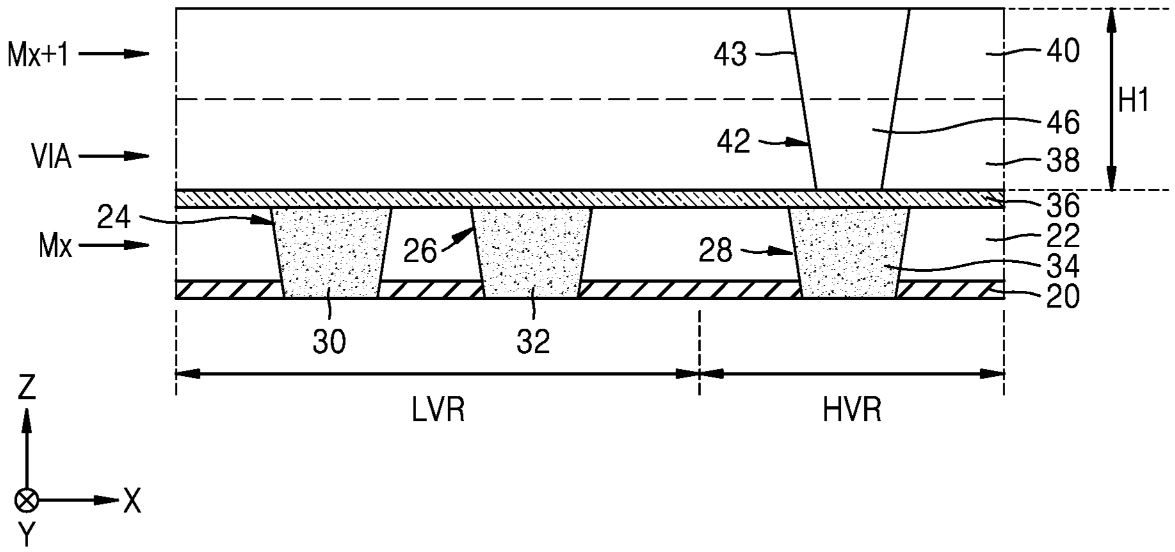

Referring to FIG. 9, the via insulating layer 38 and the second wiring insulating layer 40 disposed above the third lower wiring layer 34 may be patterned. For example, the via insulating layer 38 and the second wiring insulating layer 40 disposed above the third lower wiring layer 34 may be patterned to form a reinforced contact hole 42 and a third upper contact hole 43. The via insulating layer 38 and the second wiring insulating layer 40 may be selectively etched off by a photo etching process. For example, the via insulating layer 38 and the second wiring insulating layer 40 may be selectively etched off by the photo etching process to form the reinforced contact hole 42 and the third upper contact hole 43. The reinforced contact hole 42 and the third upper contact hole 43 may be formed on the second etch stopping layer 36 on the third lower wiring layer 34.

The via insulating layer 38 of the via level layer VIA may be selectively etched off. For example, the via insulating layer 38 of the via level layer VIA may be selectively etched off to form the reinforced contact hole 42. The second wiring insulating layer 40 may be selectively etched off. For example, to second wiring insulating layer 40 may be selectively etched off to form the third upper contact hole 43. The reinforced contact hole 42 and the third upper contact hole 43 may be formed to communicate with each other. The second etch stopping layer 36 may stop the etching process against the second wiring insulating layer 40 and the via insulating layer 38.

Figure 10:
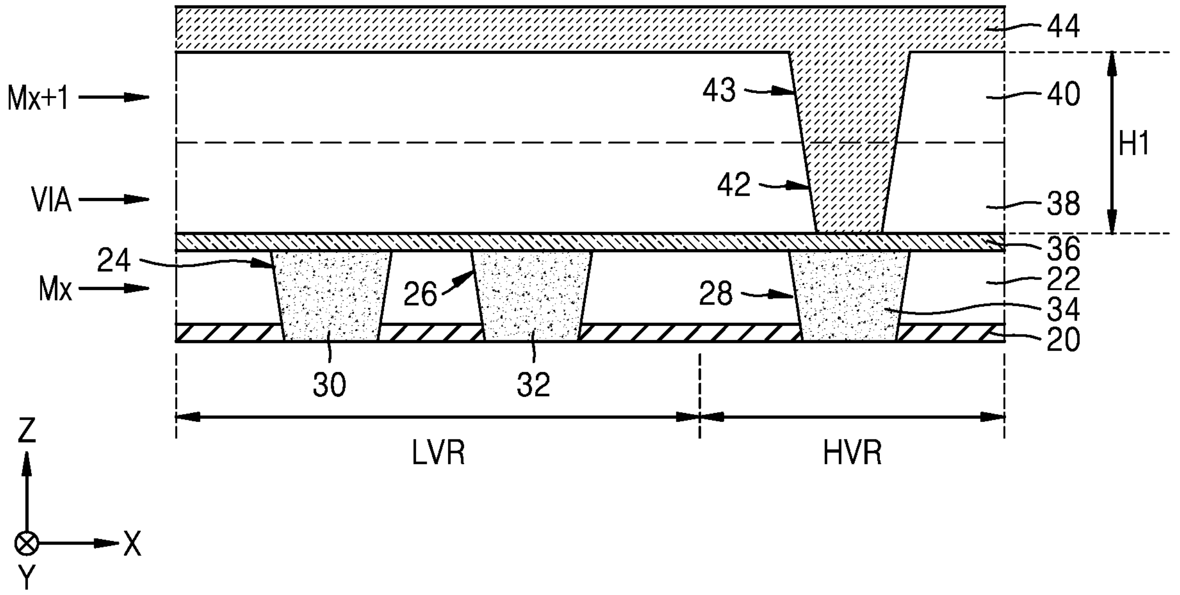
Figure 11:
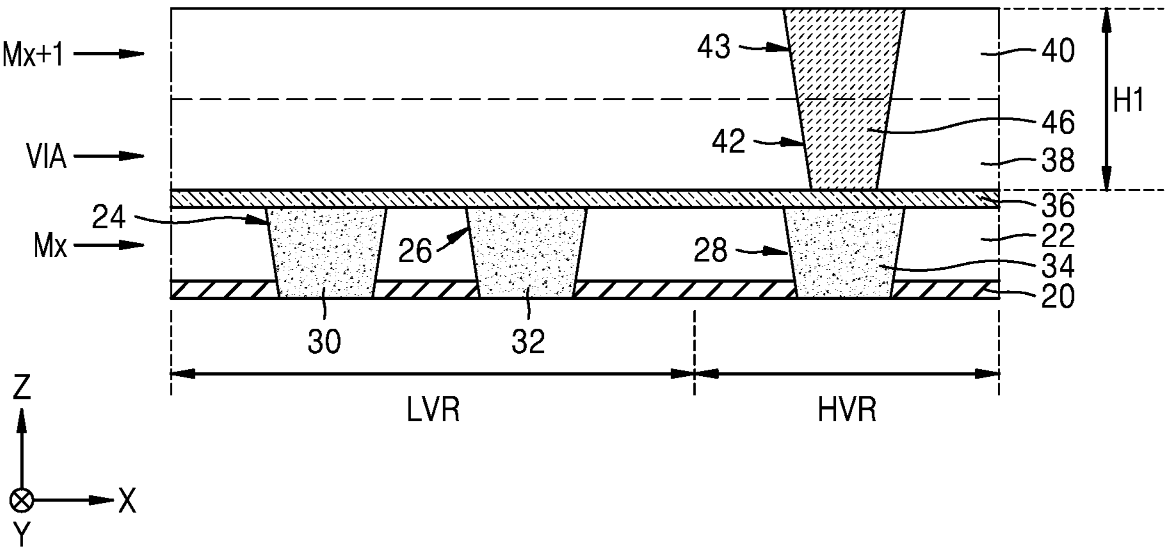

Referring to FIG. 10 and FIG. 11, as shown in FIG. 10, a reinforcing insulating material layer 44 may be formed on the second wiring insulating layer 40 to a sufficient thickness to fill up the third upper contact hole 43 and the reinforced contact hole 42. Thus, the reinforcing insulating material layer 44 may be formed on the second wiring insulating layer 40 in such a way that the third upper contact hole 43 and the reinforced contact hole 42 may be filled by the reinforcing insulating material layer 44.

The reinforcing insulating material layer 44 may be formed of a material having a dielectric constant higher than a dielectric constant of the via insulating layer 38 and the second wiring insulating layer 40. Particularly, the reinforcing insulating material layer 44 may be formed of a material having a dielectric constant that is greater than a dielectric constant of the silicon oxide layer. In some embodiments, the reinforcing insulating material layer 44 may be formed into a silicon nitride layer.

As illustrated in FIG. 11, the reinforcing insulating material layer 44 may be planarized. For example, the reinforcing insulating material layer 44 may be planarized to form a reinforcing insulating pattern 46 in the third upper contact hole 43 and the reinforced contact hole 42. The planarization of the reinforcing insulating material layer 44 may be performed by a chemical mechanical polishing (CMP) process by using the second wiring insulating layer 40 as an etching stopper. The reinforcing insulating pattern 46 may be formed on the second etch stopping layer 36 in the third upper contact hole 43 and the reinforced contact hole 42.

Figure 12:
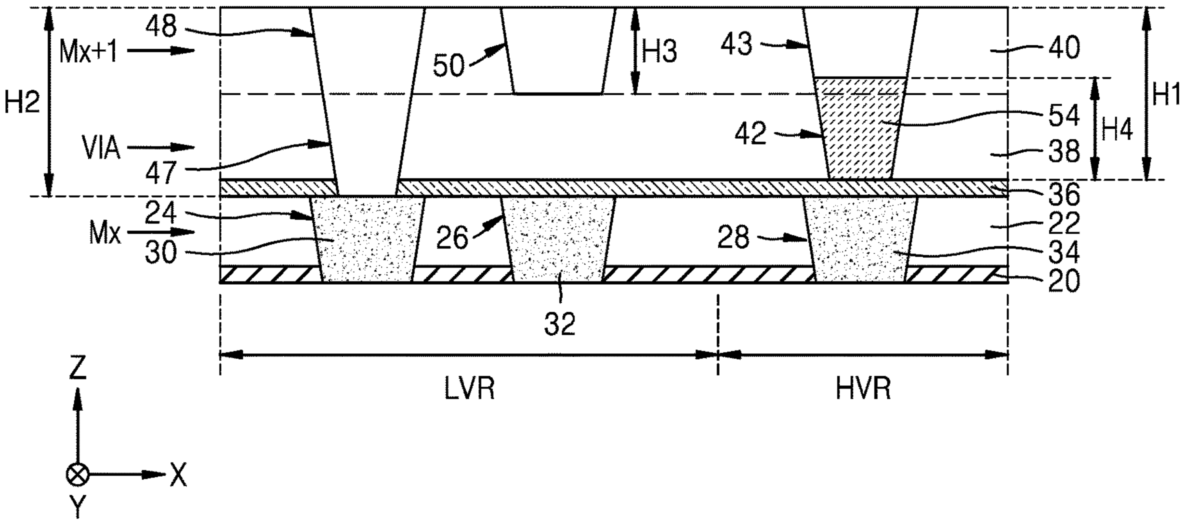

Referring to FIG. 12, the second etch stopping layer 36, the via insulating layer 38, and the second wiring insulating layer 40, which may be sequentially stacked on the first lower wiring layer 30, may be etched off. For example, the second etch stopping layer 36, the via insulating layer 38, and the second wiring insulating layer 40 may be etched off to form a first upper contact hole 48 and a via hole 47. A total height of the first upper contact hole 48 and the via hole 47 may be a second height H2.

The first upper contact hole 48 and the via hole 47 may be formed to communicate with each other. The second wiring insulating layer 40 disposed above the second lower wiring layer 32 may be selectively etched. For example, the second wiring insulating layer 40 disposed above the second lower wiring layer 32 may be selectively etched to form a second upper contact hole 50. The second upper contact hole 50 may have a third height H3.

The reinforcing insulating pattern 46 may be selectively etched from the third upper contact hole 43. For example, the reinforcing insulating pattern 46 may be selectively etched from the third upper contact hole 43 to form a reinforcing insulating layer 54. Thus, the third upper contact hole 43 may become a void as a result of the etching against an upper portion of the reinforcing insulating pattern 46. The reinforcing insulating layer 54 may be formed in the reinforced contact hole 42. An upper surface of the reinforcing insulating layer 54 may be higher than a lower surface of the second upper contact hole 50 in the Z direction.

The reinforcing insulating layer 54 may have a fourth height H4. A total height of the reinforcing insulating layer 54 and the third upper contact hole 43 may be a first height H1. The formation of the first upper contact hole 48 and the via hole 47, the formation of the second upper contact hole 50, and the formation of the third upper contact hole 43 may be performed by a photo etching process.

Figure 13:
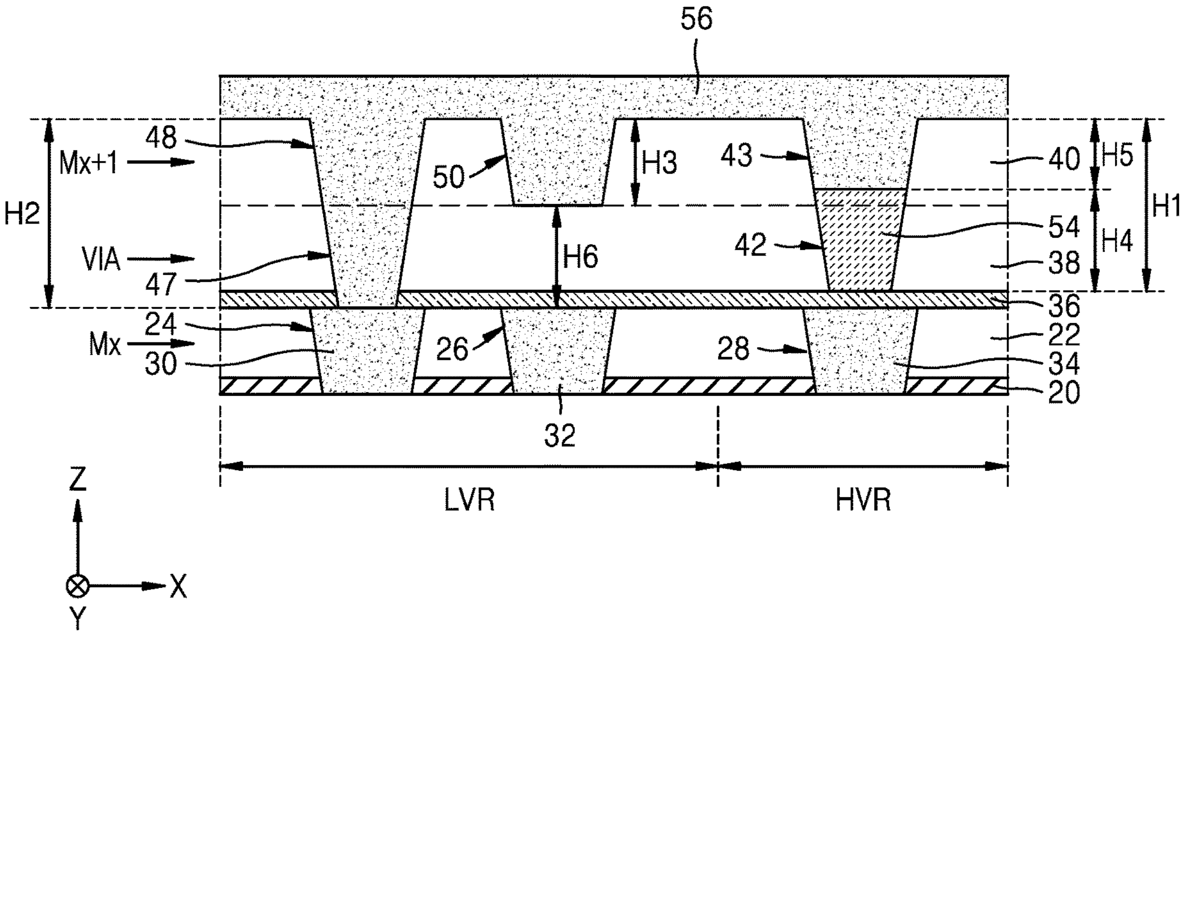

Referring to FIG. 13, a wiring material layer 56 may be formed on the second wiring insulating layer 40 in such a way that the via hole 47 and the first upper contact hole 48, the second upper contact hole 50, and the third upper contact hole 43 may be filled with the wiring material layer 56. The wiring material layer 56 may be formed into a metal layer, for example, a copper layer, an aluminum layer, and a tungsten layer.

A total height of the wiring material layer 56 in the first upper contact hole 48 and the via hole 47 may be a second height H2. A height of the wiring material layer 56 in the second upper contact hole 50 may be a third height H3. A height of the wiring material layer 56 in the third upper contact hole 43 may be a fifth height H5. A total height of the reinforcing insulating layer 54 in the reinforced contact hole 42 and the wiring material layer 56 in the third upper contact hole 43 may be a first height H1.

Subsequently, the wiring material layer 56 may be planarized. For example, the planarization of the wiring material layer 56 may form a via 57 in the via hole 47 and a first upper wiring layer 58 in the first upper contact hole 48, as shown in FIG. 3. In addition, the wiring material layer 56 may be planarized to form a second upper wiring layer 60 and a third upper wiring layer 62 in the second upper contact hole 50 and the third upper contact hole 43, respectively, as shown in FIG. 3.

The via 57, the first upper wiring layer 58, the second upper wiring layer 60, and the third upper wiring layer 62 may be simultaneously formed by the planarization process. Accordingly, the semiconductor device EX1 be manufactured to include the first wiring level layer Mx, the via level layer VIA, the second wiring level layer Mx+1, and the reinforcing insulating layer 54, as shown in FIG. 3.

Figure 14:
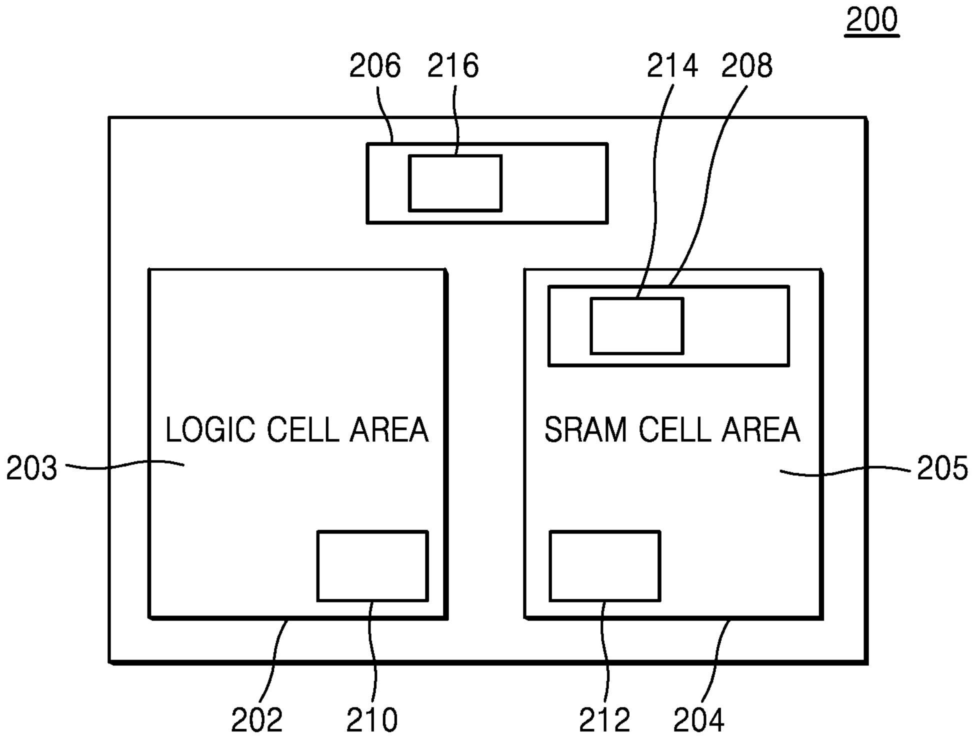
FIG. 14 is a block diagram showing a configuration of a semiconductor chip including a semiconductor device according to an embodiment.

FIG. 14 is a block diagram showing a configuration of a semiconductor chip including a semiconductor device, according to an embodiment.

Specifically, a semiconductor chip 200 may include a logic region 202, an SRAM region 204, and an input/output region 206. The semiconductor chip 200 may include semiconductor devices EX1 to EX4 according to embodiments. The logic region 202 may include a logic cell area 203. The SRAM region 204 may include an SRAM cell area 205 and an SRAM peripheral circuit area 208.

A first transistor 210 may be positioned in the logic cell area 203, and a second transistor 212 may be positioned in the SRAM cell area 205. A third transistor 214 may be positioned in the SRAM peripheral circuit area 208, and a fourth transistor 216 may be positioned in the input/output region 206.

Figure 15:
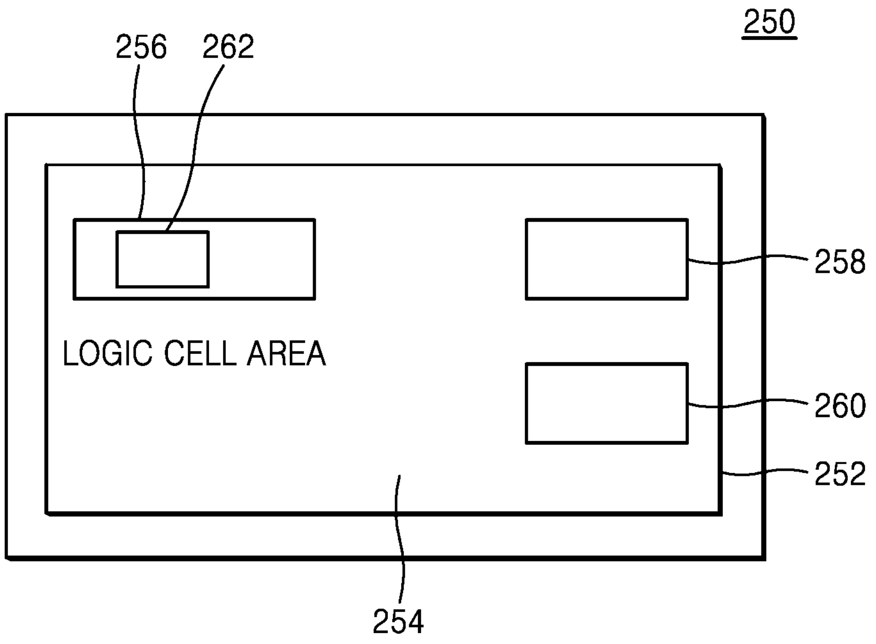
FIG. 15 is a block diagram showing a configuration of a semiconductor chip including a semiconductor device according to an embodiment.

FIG. 15 is a block diagram showing a configuration of a semiconductor chip including a semiconductor device according to an embodiment.

Specifically, a semiconductor chip 250 may include a logic region 252. The semiconductor chip 250 may include semiconductor devices EX1 to EX4 according to embodiments. The logic region 252 may include a logic cell area 254 and an input/output area 256. A first transistor 258 and a second transistor 260 may be positioned in the logic cell area 254. The first transistor 258 and the second transistor 260 may have different conductivity types. A third transistor 262 may be positioned in the input/output area 256.

Figure 16:
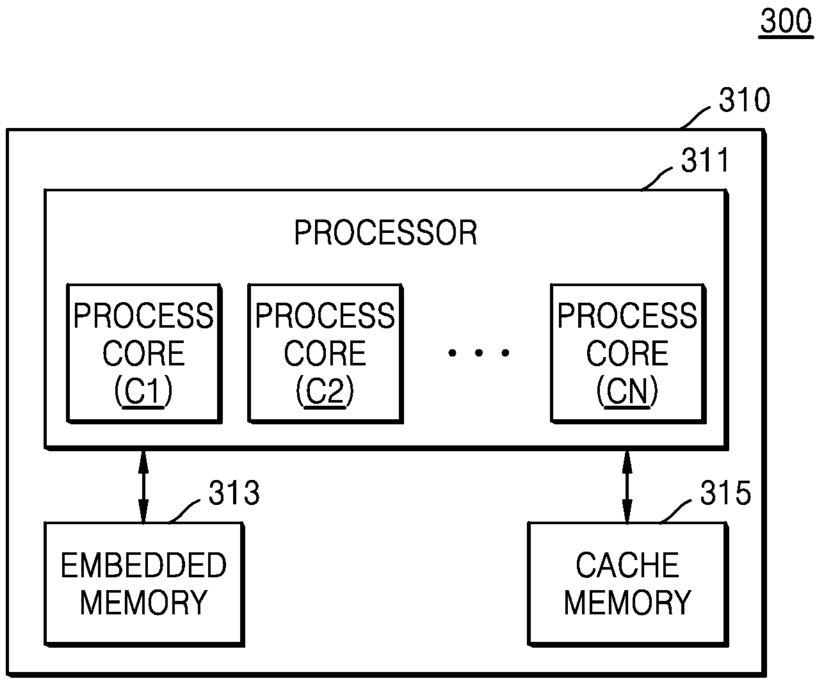
FIG. 16 is a block diagram showing a configuration of a semiconductor package including a semiconductor device according to an embodiment.
Figure 17:
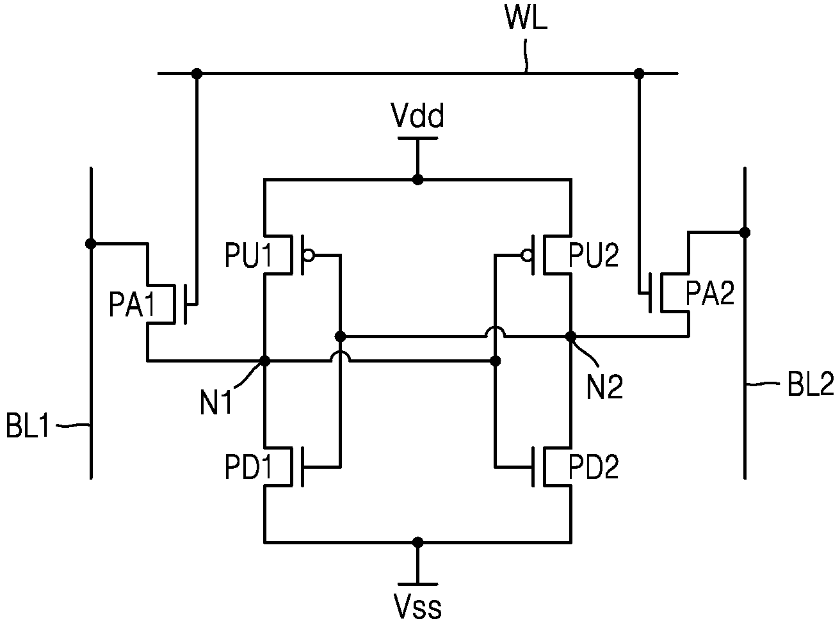
FIG. 17 is an equivalent circuit diagram of a static random access memory (SRAM) cell of the semiconductor device according to an embodiment.

FIG. 16 is a block diagram showing a configuration of a semiconductor package including a semiconductor device according to an embodiment, and FIG. 17 is an equivalent circuit diagram of an SRAM cell of the semiconductor device according to an embodiment.

Referring to FIG. 16, a semiconductor package 300 may include a system-on-chip 310. The system-on-chip 310 may include a processor 311, an embedded memory 313, and a cache memory 315. The processor 311 may include one or more processor cores C1-CN. The processor cores C1-CN may process data and signals. The processor cores C1-CN may include semiconductor devices EX1 to EX3 according to embodiments.

The semiconductor package 300 may perform a unique function by using the processed data and signals. In an embodiment, the processor 311 may include an application processor. The embedded memory 313 may exchange first data DAT1 with the processor 311. The first data DAT1 may include data processed or to be processed by the processor cores C1-CN. The embedded memory 313 may manage the first data DAT1. For example, the embedded memory 313 may buffer the first data DAT1. The embedded memory 313 may function as a buffer memory or a working memory for the processor 311.

The embedded memory 313 may be a SRAM. The SRAM may operate faster than dynamic random access memory (DRAM). Thus, the semiconductor package 300 may be manufactured in a small size with high operating speed by embedding the SRAM into the system-on-chip 310. Furthermore, the power consumption of the operating power (Active Power) for the semiconductor package 300 may be reduced by embedding the SRAM into the system-on-chip 310.

For example, the SRAM may include semiconductor devices EX1 to EX4 according to embodiments. The cache memory 315 may be mounted on the system-on-chip 310 together with the processor cores C1 to CN. The cache memory 315 may store cache data DATc. The cache data DATc may be data used by the processor cores C1 to Cn. The cache memory 315 has a small storage capacity but may operate at a very high speed.

In an embodiment, the cache memory 315 may include SRAM including the semiconductor devices EX1 to EX4 according to embodiments. When the cache memory 315 is used, the number and time of accessing the embedded memory 313 by the processor 311 may be reduced. Accordingly, when the cache memory 315 is used, the operation speed of the semiconductor package 300 may be increased. For better understanding, the cache memory 315 is illustrated as an additional element separated from the processor 311. However, the cache memory 315 may be configured to be included in the processor 311.

Referring to FIG. 17, the SRAM cell may be implemented by the semiconductor devices EX1 to EX4 according to embodiments. For example, the SRAM cell may be applied to the embedded memory 313 and/or the cache memory 315 described herein with reference to FIG. 16. The SRAM cell may include a first pull-up transistor PU1, a first pull-down transistor PD1, a second pull-up transistor PU2, a second pull-down transistor PD2, a first access transistor PA1, and a second access transistor PA2.

The first and second pull-up transistors PU1 and PU2 may include p-type metal-oxide semiconductor (MOS) transistors, while the first and second pull-down transistors PD1 and PD2 and the first and second access transistors PA1 and PA2 may include n-type MOS transistors. The first pull-up transistor PU1 and the first pull-down transistor PD1 may be formed into a first inverter. Gate electrodes (gates) of the first pull-up and first pull-down transistors PU1 and PD1, which may be connected to each other, may correspond to an input terminal of the first inverter, and a first node N1 may correspond to an output terminal of the first inverter.

The second pull-up transistor PU2 and the second pull-down transistor PD2 may be formed into a second inverter. Gate electrodes (gates) of the second pull-up and second pull-down transistors PU2 and PD2, which may be connected to each other, may correspond to an input terminal of the second inverter, and a second node N2 may correspond to an output terminal of the second inverter.

The first and second inverters may be coupled to form a latch structure. The gate electrodes of the first pull-up and first pull-down transistors PU1 and PD1 may be electrically connected to the second node N2, and the gate electrodes of the second pull-up and second pull-down transistors PU2 and PD2 may be electrically connected to the first node N1.

A first source/drain of the first access transistor PA1 may be connected to the first node N1, and a second source/drain of the first access transistor PA1 may be connected to a first bit line BL1. A first source/drain of the second access transistor PA2 may be connected to the second node N2, and a second source/drain of the second access transistor PA2 may be connected to a second bit line BL2.

Gate electrodes of the first and second access transistors PA1 and PA2 may be electrically connected to a word line WL. Accordingly, the SRAM cell may be implemented by using the semiconductor devices EX1 to EX3 according to embodiments.

Figure 18:
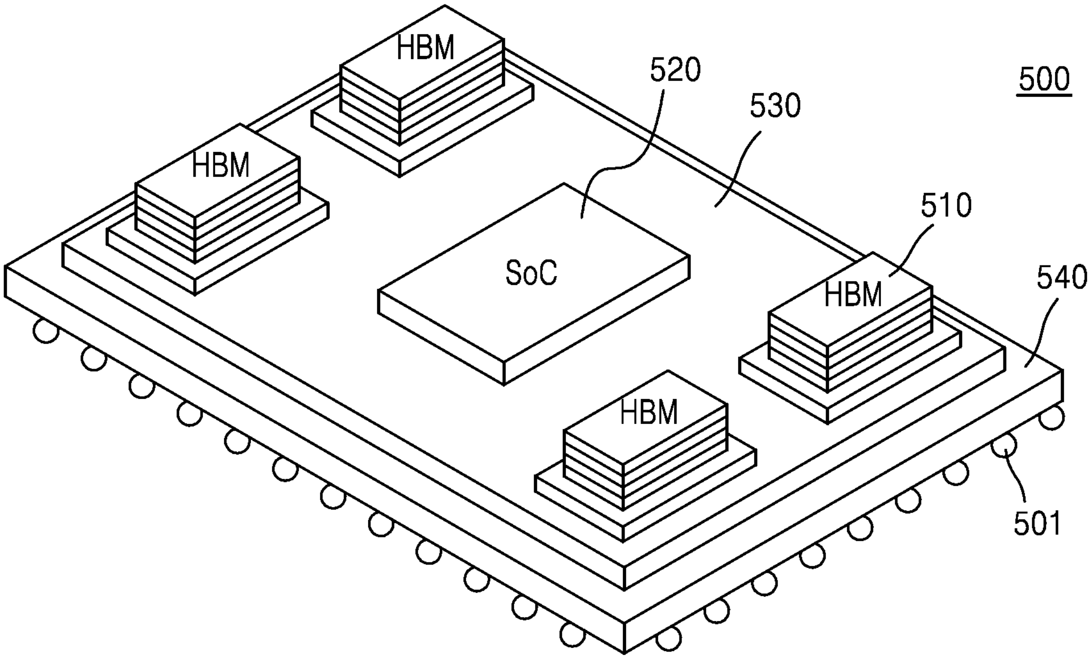
FIG. 18 is a view illustrating a semiconductor package including a semiconductor device according to an embodiment.

FIG. 18 is a view illustrating a semiconductor package including a semiconductor device according to an embodiment.

Specifically, a semiconductor package 500 according to an embodiment may include a plurality of stacked memory devices 510 and a system-on-chip 520. The stacked memory devices 510 and the system-on-chip 520 may be stacked on an interposer 530, and the interposer 530 may be stacked on the package substrate 540. The semiconductor package 500 may transmit and receive signals to and from other external packages or electronic devices through a plurality of solder balls 501 that may be attached to a lower portion of the package substrate 540.

Each of the stacked memory devices 510 may be implemented based on an HBM standard. However, the present inventive concept is not limited thereto, and each of the stacked memory devices 510 may be implemented based on a graphics double data rate (GDDR) standard, a hybrid memory cube (HMC) standard, or a wide I/O standard. Each of the stacked memory devices 510 may include semiconductor devices EX1 to EX4 according to embodiments.

The system-on-chip 520 may include at least one processor among a central processing unit (CPU), an application processor (AP), a graphics processing unit (GPU), a neural processing unit (NPU), a tensor processing unit (TPU), a vision processing unit (VPU), an image signal processor (ISP), and a digital signal processor (DSP), and may execute specialized operations.

The system-on-chip 520 may include a plurality of memory controllers for controlling a processor and the plurality of stacked memory devices 510 described herein. The system-on-chip 520 may transmit and receive signals to and from the corresponding stacked memory devices 510 by a memory controller.

Although the present inventive concept has been described herein with reference to embodiments shown in the drawings, this is merely an example, and those skilled in the art will understand that various modifications, substitution, and even other embodiments are possible. It should be understood that embodiments described herein be exemplary and not limited in all respects. The true technical protection scope of the present inventive concept should be determined by the technical idea of the appended claims.

While the inventive concept has been particularly shown and described with reference to embodiments thereof, it will be understood that various changes in form and details may be made therein without departing from the spirit and scope of the following claims.

What is claimed is:

1. A semiconductor device comprising:
- a first wiring level layer including a lower wiring layer;
- a second wiring level layer on the first wiring level layer and including an upper wiring layer;
- a via level layer positioned between the first wiring level layer and the second wiring level layer and including a via connecting the lower wiring layer to the upper wiring layer; and
- a reinforcing insulating layer positioned in a reinforced contact hole between the lower wiring layer and the upper wiring layer in the via level layer.

2. The semiconductor device of claim 1, wherein the first wiring level layer is on a semiconductor substrate, and the semiconductor substrate comprises:
- a low voltage region including a low voltage integrated circuit; and
- a high voltage region including a high voltage integrated circuit.

3. The semiconductor device of claim 2, wherein the reinforcing insulating layer is positioned in an upper portion of the high voltage region.

4. The semiconductor device of claim 2, wherein the lower wiring layer includes a plurality of lower wiring layers, and
- the upper wiring layer includes a plurality of upper wiring layers,
- wherein a first height of the upper wiring layer in the low voltage region is greater than or equal to a second height of the upper wiring layer in the high voltage region.

5. The semiconductor device of claim 1, wherein the first wiring level layer is on a semiconductor substrate and the lower wiring layer extends in a Y direction on the semiconductor substrate, and the upper wiring layer extends in an X direction perpendicular to the Y direction on the semiconductor substrate.

6. The semiconductor device of claim 1, wherein a distance between the lower wiring layer and the upper wiring layer is a height of the via.

7. The semiconductor device of claim 1, wherein an upper surface of the reinforcing insulating layer has a height greater than or equal to a height of an upper surface of the via.

8. The semiconductor device of claim 1, wherein the via level layer includes a via insulating layer, and
- a dielectric constant of the reinforcing insulating layer is greater than a dielectric constant of the via insulating layer.

9. The semiconductor device of claim 1, wherein the reinforcing insulating layer is positioned between the lower wiring layer and the upper wiring layer and encloses a portion of the upper wiring layer.

10. The semiconductor device of claim 1, wherein the first wiring level layer includes a first wiring insulating layer, the second wiring level layer includes a second wiring insulating layer, and the via level layer includes a via insulating layer, wherein a dielectric constant of the reinforcing insulating layer is greater than a dielectric constant of the first wiring insulating layer, a dielectric constant of the second wiring insulating layer, and a dielectric constant of the via insulating layer.

11. A semiconductor device comprising:

a semiconductor substrate including a first voltage region and a second voltage region;

a first wiring level layer on the semiconductor substrate and including a first lower wiring layer positioned in the first voltage region and a second lower wiring layer positioned in the second voltage region;

a second wiring level layer on the first wiring level layer and including a first upper wiring layer positioned in an upper portion of the first voltage region and a second upper wiring layer positioned in an upper portion of the second voltage region;

a via level layer positioned between the first wiring level layer and the second wiring level layer and including a via connecting the first lower wiring layer to the first upper wiring layer; and a reinforcing insulating layer positioned in a reinforced contact hole between the second lower wiring layer and the second upper wiring layer in the via level layer.

12. The semiconductor device of claim 11, wherein a height of the reinforcing insulating layer is greater than or equal to a height of the via.

13. The semiconductor device of claim 11, wherein a height of the first upper wiring layer is greater than or equal to a height of the second upper wiring layer, wherein the first upper wiring layer is a low voltage wiring layer, and the second upper wiring layer is a high voltage wiring layer.

14. The semiconductor device of claim 11, wherein the first wiring level layer includes a first wiring insulating layer, the second wiring level layer includes a second wiring insulating layer, and the via level layer includes a via insulating layer, wherein a dielectric constant of the reinforcing insulating layer is greater than a dielectric constant of the first wiring insulating layer, a dielectric constant of the second wiring insulating layer, and a dielectric constant of the via insulating layer.

15. The semiconductor device of claim 11, wherein the reinforcing insulating layer is positioned between the second lower wiring layer and the second upper wiring layer and encloses a portion of the second upper wiring layer.

16. A semiconductor device comprising:

a semiconductor substrate including a low voltage region and a high voltage region;

a first wiring level layer on the semiconductor substrate and including a low voltage lower wiring layer positioned in the low voltage region, a high voltage lower wiring layer positioned in the high voltage region, and a first wiring insulating layer insulating the low voltage lower wiring layer and the high voltage lower wiring layer;

a second wiring level layer on the first wiring level layer and including a low voltage upper wiring layer positioned in the low voltage region, a high voltage upper wiring layer positioned in the high voltage region, and a second wiring insulating layer insulating the low voltage upper wiring layer and the high voltage upper wiring layer;

a via level layer positioned between the first wiring level layer and the second wiring level layer and including a via connecting the low voltage lower wiring layer to the low voltage upper wiring layer and a via insulating layer between the first wiring level layer and the second wiring level layer; and a reinforcing insulating layer positioned between the high voltage lower wiring layer and the high voltage upper wiring layer in the via insulating layer of the via level layer.

17. The semiconductor device of claim 16, wherein an upper surface of the reinforcing insulating layer has a height greater than or equal to a height of an upper surface of the via, wherein the height of the upper surface of the via is a height of the low voltage upper wiring layer.

18. The semiconductor device of claim 16, the low voltage lower wiring layer includes a first plurality of lower wiring layers for conducting a low voltage, and the high voltage lower wiring layer includes a second plurality of lower wiring layers for conducting a high voltage, and the low voltage upper wiring layer includes a first plurality of upper wiring layers for conducting the low voltage, and the high voltage upper wiring layer includes a second plurality of upper wiring layers for conducting the high voltage, wherein a height of the low voltage upper wiring layer is greater than or equal to a height of the high voltage upper wiring layer.

19. The semiconductor device of claim 16, wherein a dielectric constant of the reinforcing insulating layer is greater than a dielectric constant of the first wiring insulating layer, a dielectric constant of the second wiring insulating layer, and a dielectric constant of the via insulating layer.

20. The semiconductor device of claim 16, wherein the reinforcing insulating layer is positioned between the high voltage lower wiring layer and the high voltage upper wiring layer and encloses a portion of the high voltage upper wiring layer.

* * * * *